United States Patent
Suzuki et al.

(10) Patent No.: US 12,275,226 B2
(45) Date of Patent: Apr. 15, 2025

(54) METHOD OF MANUFACTURING OPTICAL LAMINATE

(71) Applicant: DEXERIALS CORPORATION, Tochigi (JP)

(72) Inventors: Tsuguto Suzuki, Shimotsuke (JP); Zhen Huang, Shimotsuke (JP); Katsutoshi Suzuki, Shimotsuke (JP); Takahisa Watanabe, Shimotsuke (JP); Yuko Kibushi, Shimotsuke (JP); Tomoaki Kobayashi, Shimotsuke (JP)

(73) Assignee: DEXERIALS CORPORATION, Tochigi (JP)

( * ) Notice: Subject to any disclaimer, the term of this patent is extended or adjusted under 35 U.S.C. 154(b) by 0 days.

(21) Appl. No.: 17/905,392

(22) PCT Filed: Mar. 3, 2021

(86) PCT No.: PCT/JP2021/008165
§ 371 (c)(1),
(2) Date: Aug. 31, 2022

(87) PCT Pub. No.: WO2021/177348
PCT Pub. Date: Sep. 10, 2021

(65) Prior Publication Data
US 2023/0311448 A1    Oct. 5, 2023

(30) Foreign Application Priority Data

Mar. 4, 2020 (JP) .................. 2020-037146
Jul. 17, 2020 (JP) .................. 2020-123317
Mar. 2, 2021 (JP) .................. 2021-032929

(51) Int. Cl.
B32B 37/14    (2006.01)
B32B 7/023    (2019.01)
(Continued)

(52) U.S. Cl.
CPC ............ B32B 7/023 (2019.01); B32B 7/12 (2013.01); B32B 37/144 (2013.01); B32B 37/24 (2013.01);
(Continued)

(58) Field of Classification Search
CPC ......... B32B 7/023; B32B 7/12; B32B 37/144; B32B 37/24; B32B 38/1858;
(Continued)

(56) References Cited

U.S. PATENT DOCUMENTS 6,251,523 B1    6/2001  Takahashi et al.
8,945,684 B2    2/2015  Fournand
(Continued)

FOREIGN PATENT DOCUMENTS

CN    105779943      7/2016
CN    105835465 A    8/2016
(Continued)

OTHER PUBLICATIONS

English translation for WO 2019035398 A1 (Year: 2019).*
(Continued)

*Primary Examiner* — Nathan L Van Sell
(74) *Attorney, Agent, or Firm* — Schwegman Lundberg & Woessner, P.A.

(57) ABSTRACT

This method of manufacturing an optical laminate comprising a transparent substrate, an adhesion layer, an optical functional layer, and an antifouling layer laminated in this order, includes an adhesion layer forming step of forming the adhesion layer, an optical functional layer forming step of forming the optical functional layer, a surface treatment step of treating the surface of the optical functional layer so that the rate of change in surface roughness represented by formula (1) is 1~25%, and an antifouling layer forming step of forming the antifouling layer on the surface-treated
(Continued)

optical functional layer; Rate of change of surface roughness (%)=((Ra2/Ra1)−1)×100(%) Formula (1) (Formula (1), where Ra1 represents the surface roughness (Ra) of the optical functional layer before the surface thereof is treated, and Ra2 represents the surface roughness (Ra) of the optical functional layer after the surface thereof is treated.).

7 Claims, 3 Drawing Sheets

(51) Int. Cl.
  B32B 7/12   (2006.01)
  B32B 37/24  (2006.01)
  B32B 38/18  (2006.01)
(52) U.S. Cl.
  CPC .... *B32B 38/1858* (2013.01); *B32B 2037/246* (2013.01); *B32B 2250/03* (2013.01); *B32B 2255/10* (2013.01); *B32B 2307/412* (2013.01); *B32B 2307/418* (2013.01); *B32B 2307/538* (2013.01); *B32B 2307/584* (2013.01)
(58) Field of Classification Search
  CPC .......... B32B 2037/246; B32B 2250/03; B32B 2255/10; B32B 2307/412; B32B 2307/418; B32B 2307/538; B32B 2307/584; B32B 9/00; B32B 27/20; B32B 38/0008; B32B 2457/206; Y02E 10/50; C23C 14/024; C23C 14/08; C23C 14/10; C23C 14/12; C23C 14/5826; C23C 14/5873; C23C 14/06; G02B 1/14; G02B 1/18; G02B 1/115; G02B 1/11
  See application file for complete search history.

(56) References Cited

U.S. PATENT DOCUMENTS

| | | |
|---|---|---|
| 2009/0191391 A1 | 7/2009 | Naito et al. |
| 2010/0103523 A1 | 4/2010 | Fukui et al. |
| 2011/0117345 A1 | 5/2011 | Nishimoto et al. |
| 2012/0028005 A1 | 2/2012 | Zheng et al. |
| 2017/0139230 A1 | 5/2017 | Ambler et al. |
| 2018/0148609 A1 | 5/2018 | Ono |
| 2019/0310394 A1 | 10/2019 | Miyamoto et al. |
| 2020/0239360 A1 | 7/2020 | Minowa et al. |

FOREIGN PATENT DOCUMENTS

| | | |
|---|---|---|
| CN | 208110086 | 11/2018 |
| CN | 109074906 | 12/2018 |
| CN | 109782379 | 5/2019 |
| CN | 110537116 | 12/2019 |
| CN | 110997587 | 4/2020 |
| CN | 112513682 | 3/2021 |
| EP | 3223043 A1 | 9/2017 |
| JP | 07104103 A | 4/1995 |
| JP | 2000144097 A | 5/2000 |
| JP | 2000308846 A | 11/2000 |
| JP | 2002243906 | 8/2002 |
| JP | 2002292776 | 10/2002 |
| JP | 2004021550 | 1/2004 |
| JP | 2004170500 A | 6/2004 |
| JP | 2004170962 A | 6/2004 |
| JP | 2005301208 A | 10/2005 |
| JP | 2006175438 A | 7/2006 |
| JP | 2006220733 | 8/2006 |
| JP | 2006527402 | 11/2006 |
| JP | 2007194109 | 8/2007 |
| JP | 2008062460 A | 3/2008 |
| JP | 2009109850 A | 5/2009 |
| JP | 2010191144 A | 9/2010 |
| JP | 2011013654 A | 1/2011 |
| JP | 2014005353 | 1/2014 |
| JP | 2016128927 | 7/2016 |
| JP | 2016224443 A | 12/2016 |
| JP | 2017161893 | 9/2017 |
| JP | 2017227898 A | 12/2017 |
| JP | 2018004921 | 1/2018 |
| JP | 2018008431 | 1/2018 |
| JP | 2018527615 A | 9/2018 |
| JP | 2019035969 | 3/2019 |
| JP | 6542970 B2 | 6/2019 |
| JP | 2019086605 A | 6/2019 |
| JP | 2019196488 A | 11/2019 |
| JP | 2020519557 A | 7/2020 |
| JP | 2020148787 | 9/2020 |
| JP | 2021177200 | 11/2021 |
| JP | 2022007992 A | 1/2022 |
| JP | 2022130457 | 9/2022 |
| KR | 20110025146 | 3/2011 |
| KR | 20170076660 | 7/2017 |
| TW | 201504163 | 2/2015 |
| TW | 201711851 | 4/2017 |
| WO | WO-2014129333 A1 | 8/2014 |
| WO | WO-2015159839 A1 | 10/2015 |
| WO | WO-2017126300 A1 | 7/2017 |
| WO | WO-2018193742 A1 | 10/2018 |
| WO | WO-2018208760 A1 | 11/2018 |
| WO | WO-2019064969 A1 | 4/2019 |
| WO | WO-2019078313 A1 | 4/2019 |
| WO | WO-2020027037 A1 | 2/2020 |
| WO | WO-2021106797 A1 | 6/2021 |
| WO | WO-2021177348 A1 | 9/2021 |
| WO | WO-2021177350 A1 | 9/2021 |

OTHER PUBLICATIONS

"European Application Serial No. 21765327.8, Search Report dated May 21, 2024", (May 21, 2024), 7 pgs.
"European Application Serial No. 21763530.9, Search Report dated May 21, 2024", (May 21, 2024), 8 pgs.
"Korean Application Serial No. 10-2022-7042786, Office Action dated Jan. 25, 2024", w English Translation, (Jan. 25, 2024), 15 pgs.
"International Application Serial No. PCT/JP2021/008165, International Search Report dated May 25, 2021", w/ English Translation, (May 25, 2021), 6 pgs.
"International Application Serial No. PCT/JP2021/008165, Written Opinion dated May 25, 2021", (May 25, 2021), 5 pgs.
"International Application Serial No. PCT/JP2021/008174, International Search Report dated May 25, 2021", w/ English Translation, (May 25, 2021), 6 pgs.
"International Application Serial No. PCT/JP2021/026740, International Search Report dated Aug. 31, 2021", w/ English Translation, (Aug. 31, 2021), 6 pgs.
"International Application Serial No. PCT/JP2021/026794, International Search Report dated Aug. 31, 2021", w/ English Translation, (Aug. 31, 2021), 9 pgs.
"International Application Serial No. PCT/JP2021/032978, International Search Report dated Nov. 22, 2021", w/ English Translation, (Nov. 22, 2021), 6 pgs.
"International Application Serial No. PCT/JP2021/032991, International Search Report dated Nov. 22, 2021", w/ English Translation, (Nov. 22, 2021), 6 pgs.
"Japanese Application Serial No. 2020-037146, Office Action dated May 19, 2020", w/ English Translation, (May 19, 2020), 8 pgs.
"Japanese Application Serial No. 2020-153209, Office Action dated Dec. 1, 2020", w/ English Translation, (Dec. 1, 2020), 8 pgs.
"Japanese Application Serial No. 2022-000546, Office Action dated Mar. 15, 2022", w/ English Translation, (Mar. 15, 2022), 7 pgs.
"Japanese Application Serial No. 2022-093913, Office Action dated Jul. 5, 2022", w/ English Translation, (Jul. 5, 2022), 6 pgs.
"Japanese Application Serial No. 2023-040986, Notice of Allowance dated May 30, 2023", w English Translation, (May 30, 2023), 5 pgs.
"Korean Application No. 10-2022-7022923, Office Action dated Mar. 23, 2024", w English Translation, (Mar. 23, 2024), 15 pgs.

(56) References Cited

OTHER PUBLICATIONS

"Korean Application No. 10-2022-7022924, Office Action dated Mar. 23, 2024", w English Translation, (Mar. 23, 2024), 13 pgs.
"U.S. Appl. No. 17/905,326, Non Final Office Action mailed Jul. 24, 2024", 10 pgs.
"Chinese Application No. 202180017459.0, Office Action dated Sep. 29, 2024", w English Translation, (Sep. 29, 2024), 18 pgs.
"Chinese Application No. 202180017403.5, Office Action dated May 27, 2024", w English Translation, (May 27, 2024), 16 pgs.
"Chinese Application No. 202180017459.0, Office Action dated May 27, 2024", (May 27, 2024), 16 pgs.
"Taiwanese Application No. 110107659, Office Action dated Jun. 25, 2024", w English Translation, (Jun. 25, 2024), 11 pgs.
"U.S. Appl. No. 17/998,449, Non Final Office Action mailed Dec. 4, 2024", 20 pgs.
"Korean Application No. 10-2022-7022923, Office Action dated Nov. 26, 2024", w English Translation, (Nov. 26, 2024), 8 pgs.
"U.S. Appl. No. 17/905,326, Final Office Action mailed Dec. 20, 2024", 11 pgs.
"U.S. Appl. No. 18/044,295, Non Final Office Action mailed Jan. 14, 2025", 15 pgs.
"Taiwanese Application No. 110133458, Office Action dated Jan. 3, 2025", w English Translation, (Jan. 3, 2025), 15 pgs.
"Japanese Application No. 2022-148971, Office Action dated Feb. 25, 2025", w English Translation, (Feb. 25, 2025), 8 pgs.
"Japanese Application No. 2022-182614, Office Action dated Feb. 25, 2025", w English Translation, (Feb. 25, 2025), 11 pgs.

\* cited by examiner

METHOD OF MANUFACTURING OPTICAL LAMINATE

PRIORITY APPLICATIONS

This application is a U.S. National Stage Filing under 35 U.S.C. § 371 from International Application No. PCT/JP2021/008165, filed on Mar. 3, 2021, and published as WO2021/177348 on Sep. 10, 2021, which claims the benefit of priority to Japanese Patent Application No. 2020-37146, filed Mar. 4, 2020, and Japanese Patent Application No. 2020-123317, filed Jul. 17, 2020, and Japanese Patent Application No. 2021-32929, filed Mar. 2, 2021; the benefit of priority of each of which is hereby claimed herein, and which applications and publication are hereby incorporated herein by reference in their entireties.

TECHNICAL FIELD

The present invention relates to an optical laminate having an antifouling layer on a surface thereof, an article provided with the same, and a method of manufacturing the optical laminate.

BACKGROUND ART

For example, in flat panel displays (FPD), touch panels, solar cells, and the like, various anti-reflective films are used as optical laminates for preventing surface reflection. Conventionally, as an anti-reflective film, an anti-reflective film having a multilayer film in which a high refractive index layer and a low refractive index layer are sequentially laminated on a transparent substrate has been proposed. Generally, an antifouling layer (surface protective layer) is formed on the outermost surface of the anti-reflective film for the purpose of surface protection and antifouling.

In recent years, anti-reflective films (optical laminates) have been frequently used in touch panels of smart phones and various operating devices. Thus, it is required to improve the abrasion resistance of the optical laminate.

For example, Patent Literature 1 discloses a transparent substrate laminate having improved abrasion resistance by setting the amount of fluorine contained in the constituent material of the antifouling layer to a specific range.

Patent Literature 2 discloses a method of forming an antifouling layer in which at least one surface of a substrate to be treated is pretreated before the antifouling layer is formed, and the antifouling layer is formed on the pretreated surface. Patent Literature 2 discloses that the pretreatment is any one of a high-frequency discharge plasma method, an electron beam method, an ion beam method, a vapor deposition method, a sputtering method, an alkali treatment method, an acid treatment method, a corona treatment method, and an atmospheric pressure glow discharge plasma method.

Patent Literature 3 discloses a method of manufacturing an antifouling optical article in which an anti-reflective film is formed on the surface of a substrate by vapor deposition, oxygen or argon is introduced to perform plasma treatment, and then an antifouling layer is formed by vacuum vapor deposition of a fluorine-containing organosilicon compound.

CITATION LIST

Patent Literature

Patent Literature 1: PCT International Publication No. 2019/078313
Patent Literature 2: Japanese Unexamined Patent Application, First Publication No. 2006-175438
Patent Literature 3: Japanese Unexamined Patent Application, First Publication No. 2005-301208
Patent Literature 4: Japanese Examined Patent Application No. 6542970

SUMMARY OF INVENTION

Problems to be Solved by the Invention

However, the transparent substrate laminate described in Patent Literature 1 has a problem that, when friction is repeated, an unreacted material contributing to abrasion resistance is rubbed off, and a high abrasion resistance cannot be maintained. Optical laminates with antifouling layers that can maintain high abrasion resistance against repeated friction have been required.

It is an object of the present invention to provide an optical laminate having an antifouling layer capable of maintaining high abrasion resistance against repeated friction, an article having the same, and a method of manufacturing the optical laminate.

Means for Solving the Problems

In order to solve the above problem, the present invention proposes the following means.

(1) A method of manufacturing an optical laminate according to a first aspect of the present invention is a method of manufacturing an optical laminate comprising a transparent substrate, an adhesion layer, an optical functional layer, and an antifouling layer laminated in this order, including:

an adhesion layer forming step of forming the adhesion layer, an optical functional layer forming step of forming the optical functional layer, a surface treatment step of treating the surface of the optical functional layer so that the rate of change in surface roughness represented by formula (1) is 1~25%, and an antifouling layer forming step of forming the antifouling layer on the surface-treated optical functional layer;

Rate of change of surface roughness (%)=(($Ra2/Ra1$)−1)×100(%) Formula (1) (Formula (1), where $Ra1$ represents the surface roughness (Ra) of the optical functional layer before the surface thereof is treated, and $Ra2$ represents the surface roughness (Ra) of the optical functional layer after the surface thereof is treated.).

(2) A method of manufacturing an optical laminate according to a second aspect of the present invention is a method of manufacturing an optical laminate comprising a transparent substrate, an adhesion layer, an optical functional layer, and an antifouling layer laminated in this order, including:

an adhesion layer forming step of forming the adhesion layer, an optical functional layer forming step of forming the optical functional layer, a surface treatment step of performing glow discharge treatment on the surface of the optical functional layer, and an antifouling layer forming step of forming the antifouling layer on the surface-treated optical functional layer.

(3) In method of manufacturing the optical laminate according to the above-described embodiment, in the adhesion layer forming step and the optical functional layer forming step, the adhesion layer and the optical functional layer may be formed by sputtering.

(4) In method of manufacturing the optical laminate according to the above-described embodiment, in the adhesion layer forming step, the adhesion layer may be formed by vacuum deposition.

(5) In method of manufacturing the optical laminate according to the above-described embodiment, the adhesion layer forming step, the optical functional layer forming step and the surface treatment step may be continuously performed under reduced pressure.

(6) The method of manufacturing the optical laminate according to the above-described embodiment may further include a hard coat layer forming step of forming a hard coat layer before the adhesion layer forming step.

(7) In the method of manufacturing the optical laminate according to the above-described embodiment, the optical functional layer may be one kind selected from an anti-reflection layer, a selective reflection layer and an antiglare layer.

(8) In the method of manufacturing the optical laminate according to the above-described embodiment, the optical functional layer may include a low refractive index layer.

(9) In the method of manufacturing the optical laminate according to the above-described embodiment, the optical functional layer forming step may be a step of alternately laminating the low refractive index layer and the high refractive index layer to form a laminate.

(10) In the method of manufacturing the optical laminate according to the above-described embodiment, in the surface treatment step, the surface of the low refractive index layer may be treated.

(11) In the method of manufacturing the optical laminate according to the above-described embodiment, the low refractive index layer may contain an oxide of Si.

(12) An optical laminate according to a third aspect of the present invention is an optical laminate comprising a transparent substrate, an adhesion layer, an optical functional layer, and an antifouling layer laminated in this order, wherein the antifouling layer is formed of a vapor-deposited film obtained by vapor deposition of an antifouling material,

(13) In the optical laminate according to the above-described embodiment, the optical functional layer may be one kind selected from an anti-reflection layer, a selective reflection layer and an antiglare layer.

(14) In the optical laminate according to the above-described embodiment, the optical functional layer may comprise a low refractive index layer.

(15) In the optical laminate according to the above-described embodiment, the optical functional layer may be a laminate in which a low refractive index layer and a high refractive index layer are alternately laminated.

(16) In the optical laminate according to the above-described embodiment, the antifouling layer may be provided in contact with the low refractive index layer.

(17) In the optical laminate according to the above-described embodiment, the adhesion layer may contain an oxide of Si.

(18) In the optical laminate according to the above-described embodiment, the antifouling material may contain a fluorine-based organic compound.

(19) In the optical laminate according to the above-described embodiment, a hard coat layer may be further provided between the transparent substrate and the adhesion layer.

(20) An article according to a fourth aspect of the present invention is an article comprising the optical laminate according to the above-described embodiment.

(21) A method of manufacturing an optical laminate according to a fifth aspect of the present invention is a method of manufacturing the optical laminate according to the above-described embodiment including an antifouling layer forming step of forming the antifouling layer composed of a vapor-deposited film in which an antifouling material is deposited by vacuum deposition on one surface side of the optical functional layer.

(22) The method of manufacturing an optical laminate according to the above-described embodiment may include an optical functional layer forming step of forming the optical functional layer by sputtering, and the optical functional layer forming step and the antifouling layer forming step may be continuously performed under reduced pressure.

Effects of the Invention

According to the present invention, it is possible to provide an optical laminate provided with an antifouling layer capable of maintaining high abrasion resistance even against repeated friction, an article provided with the same, and a method of manufacturing the optical laminate.

EMBODIMENTS FOR CARRYING OUT THE INVENTION

Hereinafter, this embodiment will be described in detail with reference to the drawings. The drawings used in the following description may show, for convenience's sake, the features of the present invention in enlarged form, and the dimensional proportions of the components may be different from those in practice. The materials, dimensions, and the like exemplified in the following description are only examples, and the present invention is not limited thereto, and the invention can be carried out by appropriately changing the materials, dimensions, and the like as long as the effects thereof are achieved.

[Optical Laminate]

Figure 1:
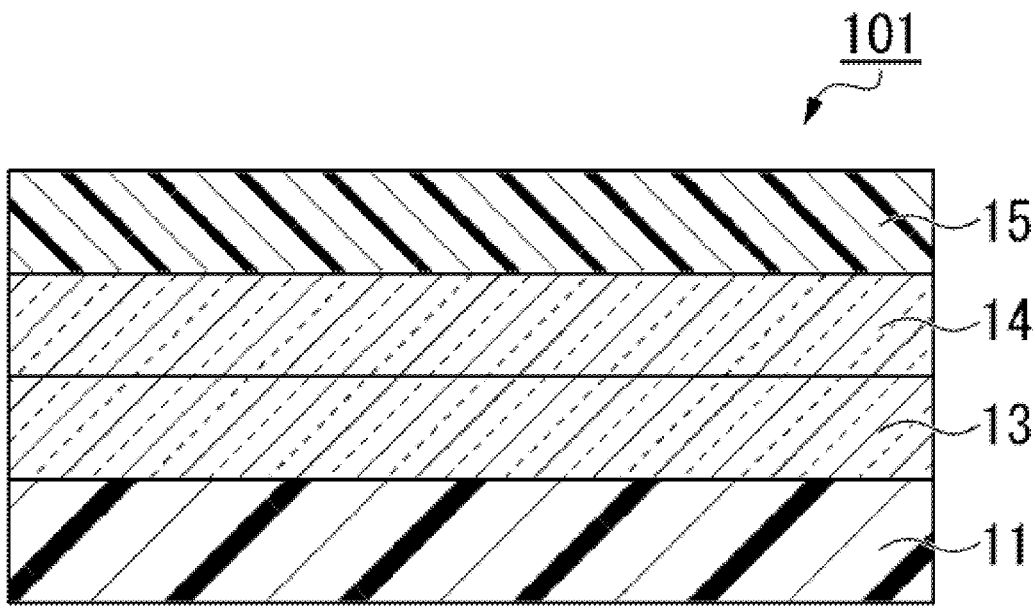
FIG. 1 is a cross-sectional view illustrating one example of an optical laminate of the present invention.

FIG. 1 is a cross-sectional view illustrating one example of the optical laminate of the present embodiment.

As illustrated in FIG. 1, an optical laminate 101 of the present embodiment is obtained by laminating a transparent substrate 11, an adhesion layer 13, an optical functional layer 14 and an antifouling layer 15 in this order.

The adhesion layer 13 is a layer that exhibits adhesion.

The optical functional layer 14 is a layer that exhibits an optical function. The optical function is a function for controlling reflection, transmission, and refraction, which are properties of light, and examples thereof include an anti-reflection function, a selective reflection function, an antiglare function, and a lens function.

The optical functional layer 14 is preferably any one selected from an anti-reflective layer, a selective reflection layer, and an antiglare layer. Known layers can be used as the anti-reflective layer, the selective reflection layer, and the antiglare layer. Each of the anti-reflective layer, the selective reflection layer, and the antiglare layer may be a single layer or may be a laminate of a plurality of layers.

Figure 2:
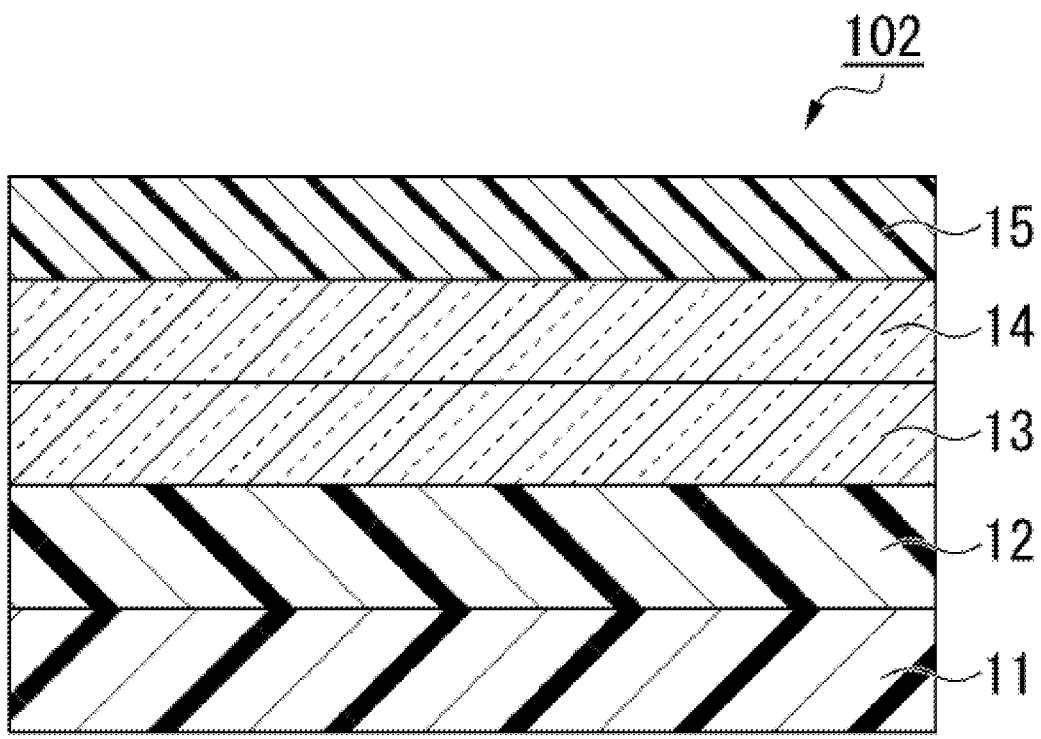
FIG. 2 is a cross-sectional view illustrating another example of an optical laminate of the present invention.

FIG. 2 is a cross-sectional view illustrating another example of the optical laminate of the present embodiment.

An optical laminate 102 illustrated in FIG. 2 is obtained by laminating a transparent substrate 11, a hard coat layer 12, an adhesion layer 13, an optical functional layer 14 and an antifouling layer 15 in this order.

The adhesion layer 13 is a layer that exhibits adhesion.

The optical functional layer 14 is a layer that exhibits an optical function. The optical function is a function for controlling reflection, transmission, and refraction, which are properties of light, and examples thereof include an anti-reflection function, a selective reflection function, an antiglare function, and a lens function.

The optical functional layer 14 is preferably any one selected from an anti-reflective layer, a selective reflection layer, and an antiglare layer. Known layers can be used as the anti-reflective layer, the selective reflection layer, and the antiglare layer. Each of the anti-reflective layer, the selective reflection layer, and the antiglare layer may be a single layer or may be a laminate of a plurality of layers.

Figure 3:
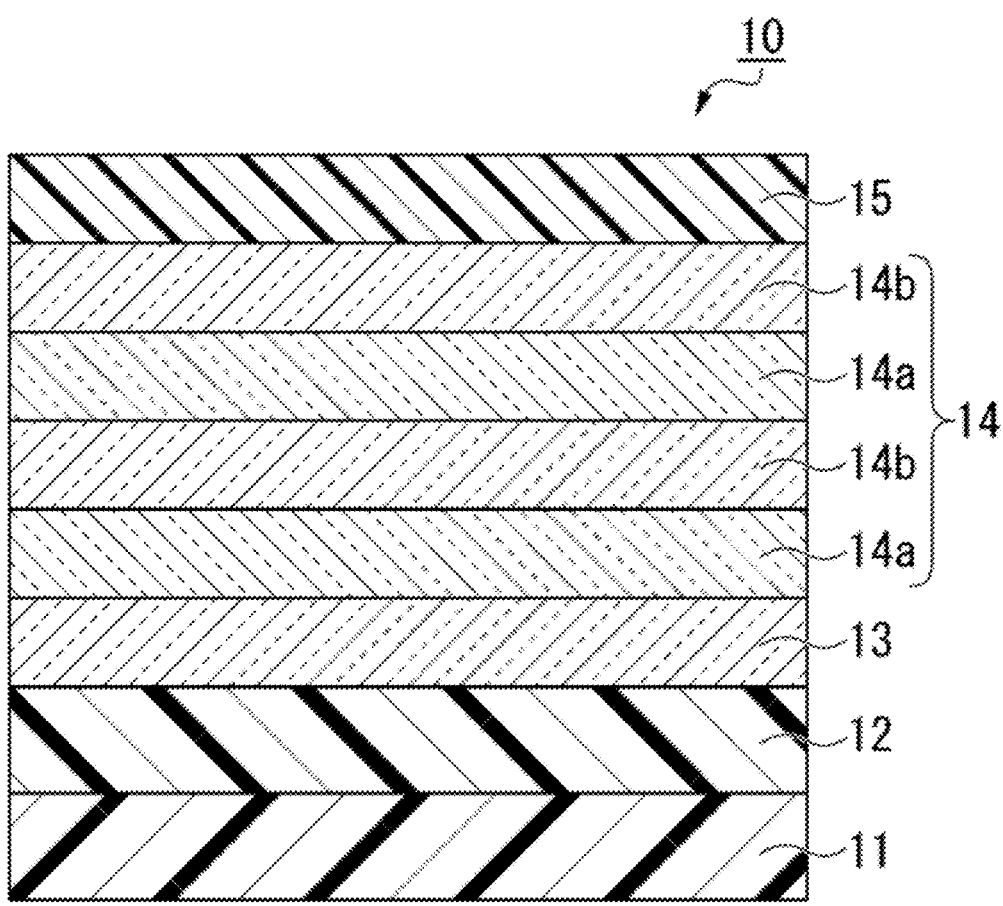
FIG. 3 is a cross-sectional view illustrating another example of an optical laminate of the present invention.

FIG. 3 is a cross-sectional view illustrating another example of the optical laminate of the present embodiment.

An optical laminate 101 illustrated in FIG. 3 includes an anti-reflective layer as an optical functional layer 14 in an optical laminate 102 illustrated in FIG. 2. As illustrated in FIG. 2, in the optical functional layer (anti-reflective layer) 14 is formed of a laminate in which a low refractive index layer 14b and a high refractive index layer 14a are alternately laminated. The optical functional layer 14 illustrated in FIG. 2 includes a hard coat layer 12, an adhesion layer 13, a high refractive index layer 14a, a low refractive index layer 14b, the high refractive index layer 14a, the low refractive index layer 14b, and an antifouling layer 15 laminated in this order from the transparent substrate 11 side. Therefore, the antifouling layer 15 is in contact with the low refractive index layer 14b of the optical functional layer 14.

The transparent substrate 11 may be formed of a transparent material capable of transmitting light in the visible light range, and for example, a plastic film is preferably used as the transparent substrate 11. Specific examples of the constituent materials of the plastic film include polyester-based resins, acetate-based resins, polyethersulfone-based resins, polycarbonate-based resins, polyamide-based resins, polyimide-based resins, polyolefin-based resins, (meth)acrylic-based resins, polyvinyl chloride-based resins, polyvinylidene chloride-based resins, polystyrene-based resins, polyvinyl alcohol-based resins, polyarylate-based resins, and polyphenylene sulfide-based resins.

The term 'transparent material' as used in the present invention refers to a material having a light transmittance of 80% or more in a wavelength range used without impairing the effect of the present invention.

In the present embodiment, '(meth) acrylic' means methacrylic and acrylic.

The transparent substrate 11 may include a reinforcing material, and examples of the reinforcing material include cellulose nanofibers and nanosilica, as long as the optical properties are not significantly impaired. Especially, polyester-based resins, acetate-based resins, polycarbonate-based resins and polyolefin-based resins are preferably used. Specifically, a triacetylcellulose (TAC) substrate is preferably used.

Alternatively, a glass film may be used as the inorganic substrate.

When the plastic film is a TAC substrate and the hard coat layer 12 is formed on one side thereof, a permeation layer is formed by permeation of some of the components constituting the hard coat layer 12. As a result, the adhesion between the transparent substrate 11 and the hard coat layer 12 is improved, and the occurrence of interference fringes caused by a difference in refractive index between the layers can be suppressed.

The transparent substrate 11 may be a film imparted with an optical function and/or a physical function. Examples of films having optical and/or physical functions include polarizing plates, phase difference compensation films, heat ray blocking films, transparent conductive films, brightness enhancing films, barrier property enhancing films, and the like.

The thickness of the transparent substrate 11 is not particularly limited, but is, for example, preferably 25 μm or greater. The film thickness of the transparent substrate 11 is more preferably 40 μm or greater.

When the thickness of the transparent substrate 11 is 25 μm or greater, the rigidity of the substrate itself is secured, and wrinkles are less likely to occur even if stress is applied to the optical laminate 10. In addition, it is preferable that the thickness of the transparent substrate 11 is 25 μm or greater, even if the hard coat layer 12 is continuously formed on the transparent substrate 11, wrinkles are less likely to occur, and there are few manufacturing concerns. When the thickness of the transparent substrate 11 is 40 μm or greater, wrinkles are even less likely to occur, which is preferable.

When production is performed using a roll, the thickness of the transparent substrate 11 is preferably 1,000 μm or less, and more preferably 600 μm or less. When the thickness of the transparent substrate 11 is 1000 μm or less, the optical laminate 10 during production and the optical laminate 10 after production can be easily wound into a roll shape, and the optical laminate 10 can be efficiently produced. Furthermore, when the thickness of the transparent substrate 11 is 1000 μm or less, the optical laminate 10 can be made thinner and lighter. It is preferable that the thickness of the transparent substrate 11 be 600 μm or less because it is possible to more efficiently manufacture the optical laminate 10 and further reduce the thickness and weight.

The surface of the transparent substrate 11 may be preliminarily subjected to an etching treatment such as sputtering, corona discharge, ultraviolet irradiation, electron beam irradiation, chemical treatment, oxidation, or the like and/or an undercoat treatment. By performing these treatments in advance, the adhesion to the hard coat layer 12 formed on the transparent substrate 11 can be improved. In addition, before the hard coat layer 12 is formed on the transparent substrate 11, the surface of the transparent substrate 11 is preferably subjected to solvent cleaning, ultrasonic cleaning, or the like as necessary to remove dust and clean the surface of the transparent substrate 11.

A known hard coat layer can be used as the hard coat layer 12. The hard coat layer 12 may be formed only a binder resin, or may contain a filler together with the binder resin within a range that does not impair transparency. As the filler, a filler composed of an organic material may be used, a filler composed of an inorganic material may be used, or a filler composed of an organic material and an inorganic material may be used.

The binder resin used in the hard coat layer 12 is preferably a transparent binder resin. For example, an ionizing radiation curable resin, a thermoplastic resin, a thermosetting resin, or the like, which is a resin that is cured by ultraviolet light or an electron beam, can be used.

Examples of ionizing radiation curable resins used in the binder resin of the hard coat layer 12 include ethyl (meth) acrylate, ethylhexyl (meth) acrylate, styrene, methylstyrene, N-vinylpyrrolidone, and the like.

Furthermore, examples of the compound that is an ionizing radiation curable resin having two or more unsaturated bonds include multi-functional compounds, such as trimethylolpropane tri (meth) acrylate, tripropylene glycol di (meth) acrylate, diethylene glycol di (meth) acrylate, dipropylene glycol di (meth) acrylate, pentaerythritol tri (meth) acrylate, pentaerythritol tetra (meth) acrylate, dipentaerythritol hexa (meth) acrylate, 1,6-hexanediol di (meth) acrylate, neopentyl glycol di (meth) acrylate, trimethylolpropane tri (meth) acrylate, ditrimethylolpropane tetra (meth) acrylate, dipentaerythritol penta (meth) acrylate, tripentaerythritol octa (meth) acrylate, tetrapentaerythritol deca (meth) acrylate, isocyanuric acid tri (meth) acrylate, isocyanuric acid di (meth) acrylate, polyester tri (meth) acrylate, polyester di (meth) acrylate, bisphenol di (meth) acrylate, diglycerin tetra (meth) acrylate, adamantyl di (meth) acrylate, isoboronyldi (meth) acrylate, dicyclopentane di (meth) acrylate, tricyclodecane di (meth) acrylate, and ditrimethylolpropane tetra (meth) acrylate. Among these, pentaerythritol triacrylate (PETA), dipentaerythritol hexaacrylate (DPHA), and pentaerythritol tetraacrylate (PETTA) are preferably used. Note that '(meth) acrylate' refers to methacrylate and acrylate. Furthermore, the ionizing radiation curable resin can also be a resin obtained by modifying the compound described above with PO (propylene oxide), EO (ethylene oxide), CL (caprolactone), or the like.

Examples of the thermoplastic resin used in the binder resin of the hard coat layer 12 include styrene-based resins, (meth) acrylic-based resins, vinyl acetate-based resins, vinyl ether-based resins, halogen-containing resins, alicyclic olefin-based resins, polycarbonate-based resins, polyester-based resins, polyamide-based resins, cellulose derivatives, silicone-based resins, and rubbers or elastomers. The thermoplastic resin is preferably amorphous and soluble in an organic solvent (in particular, a common solvent capable of dissolving the plurality of polymers and the curable compound). In particular, from the perspective of transparency and weather resistance, styrene-based resins, (meth) acrylic-based resins, alicyclic olefin-based resins, polyester-based resins, cellulose derivatives (cellulose esters and the like), and the like are preferable.

Examples of thermosetting resins used in the binder resin of the hard coat layer 12 include phenol resins, urea resins, diallyl phthalate resins, melamine resins, guanamine resins, unsaturated polyester resins, polyurethane resins, epoxy resins, aminoalkyd resins, melamine-urea co-condensation resins, silicon resins, polysiloxane resins (including so-called silsesquioxanes such as cage-like, ladder-like, and the like), and the like.

The hard coat layer 12 may contain an organic resin and an inorganic material, or may contain an organic-inorganic hybrid material. One example includes those formed by a sol-gel method. Examples of the inorganic material include silica, alumina, zirconia, and titania. Examples of the organic material include acrylic resins.

From the perspectives of antiglare property, adhesion to an optical functional layer 14 described below, and anti-blocking property, various fillers can be selected according to the application of the optical laminate 10. Specifically, for example, known silica (Si oxide) particles, alumina (aluminum oxide) particles, organic microparticles, and the like can be used.

The hard coat layer 12 may contain, for example, a binder resin and silica particles and/or alumina particles as a filler. Fine recesses and protrusions can be formed on the surface of the hard coat layer 12 by dispersing silica particles and/or alumina particles as a filler in the hard coat layer 12. These silica particles and/or alumina particles may be exposed on the surface of the hard coat layer 12 on the optical functional layer 14 side. In this case, the binder resin of the hard coat layer 12 and the optical functional layer 14 are strongly bonded. Therefore, adhesion between the hard coat layer 12 and the optical functional layer 14 is improved, hardness of the hard coat layer 12 is increased, and scratch resistance of the optical laminate 10 is favorable.

The average particle size of the silica particles and/or alumina particles as the filler of the hard coat layer 12 is, for example, 800 nm or less, preferably 780 nm or less, and more preferably 100 nm or less.

From the perspective of improving antiglare property of the optical laminate 10, organic microparticles can be used as the filler contained in the hard coat layer 12. Examples of the organic microparticles include acrylic resins and the like. The particle size of the organic microparticles is preferably 10 μm or less, more preferably 5 μm or less, and particularly preferably 3 μm or less.

Various reinforcing materials can be used as the filler contained in the hard coat layer 12 within a range that does not impair optical properties in order to impart toughness to the hard coat layer 12. Examples of the reinforcing material include cellulose nanofibers.

The thickness of the hard coat layer 12 is not particularly limited, but is, for example, preferably 0.5 μm or greater, and more preferably 1 μm or greater. The thickness of the hard coat layer 12 is preferably 100 μm or less. When the thickness of the hard coat layer 12 is 0.5 μm or greater, sufficient hardness can be obtained, and thus scratches during production are less likely to occur. In addition, when the thickness of the hard coat layer 12 is 100 μm or less, the optical laminate 10 can be made thinner and lighter. In addition, when the thickness of the hard coat layer 12 is 100 μm or less, micro-cracking of the hard coat layer 12 that occurs when the optical laminate 10 is bent during production is less likely to occur, and productivity is improved.

The hard coat layer 12 may be a single layer or may be formed by laminating a plurality of layers. Furthermore, known functions such as ultraviolet absorption performance, antistatic performance, refractive index adjustment function, and hardness adjustment function may be further imparted to the hard coat layer 12.

Furthermore, the function imparted to the hard coat layer 12 may be imparted to a single hard coat layer or may be divided into a plurality of layers and imparted.

The adhesion layer 13 is a layer formed to improve adhesion between the transparent substrate 11 or the hard coat layer 12, which is an organic film, and the optical functional layer 14, which is an inorganic film. In an optical laminate 10 illustrated in FIG. 3, an adhesion layer 13 is provided between the hard coat layer 12 and the optical functional layer 14. The adhesion layer 13 functions to adhere the hard coat layer 12 and the optical functional layer 14 to each other. The adhesion layer 13 is preferably formed of a metal oxide or a metal in a state of oxygen deficiency. A metal oxide in a state of oxygen deficiency refers to a metal oxide in a state where the number of oxygen atoms is less than the stoichiometric composition. Examples of the oxygen-deficient metal oxide include SiOx, AlOx, TiOx, ZrOx, CeOx, MgOx, ZnOx, TaOx, SbOx, SnOx, MnOx, and the like. Examples of the metal include Si, Al, Ti, Zr, Ce, Mg, Zn, Ta, Sb, Sn, Mn, In, and the like. The adhesion layer 13 may be formed of, for example, SiOx in which x is greater than 0 and less than 2.0. Furthermore, the adhesion layer may be formed of a mixture of a plurality of types of metals or metal oxides.

From the perspectives of maintaining transparency and adhesion between the optical functional layer and obtaining good optical properties, the thickness of the adhesion layer is preferably greater than 0 nm and 20 nm or less, and particularly preferably 1 nm or greater and 10 nm or less.

The optical functional layer 14 is a laminate that exhibits an anti-reflective function. The optical functional layer 14 illustrated in FIG. 3 is a laminate of a total of four layers in which a high refractive index layer 14a and a low refractive index layer 14b are alternately laminated in this order from the adhesion layer 13 side. The number of layers of the high refractive index layer 14a and the low refractive index layer 14b is not particularly limited, and the number of layers of the high refractive index layer 14a and the low refractive index layer 14b can be any number.

In the optical laminate 10 illustrated in FIG. 3, the optical functional layer 14 is formed of a laminate in which the low refractive index layer 14b and the high refractive index layer 14a are alternately laminated, so light incident from the antifouling layer 15 side is diffused by the optical functional layer 14. Therefore, an anti-reflective function of preventing light incident from the antifouling layer 15 side from being reflected in one direction can be obtained.

From the perspectives of availability and cost, the low refractive index layer 14b preferably includes an oxide of Si, and is preferably a layer including an oxide of $SiO_2$ (Si) or the like as a main component. The $SiO_2$ monolayer is clear and colorless. In the present embodiment, the main component of the low refractive index layer 14 b means a component contained in 50 mass % or more in the low refractive index layer 14 b.

When the low refractive index layer 14b is a layer containing an oxide of Si as a main component, the low refractive index layer 14b may contain less than 50 mass % of another element. The content of elements other than the oxide of Si is preferably 10% or less. Examples of other elements include Na for the purpose of improving durability, Zr and Al for the purpose of improving hardness, and N for the purpose of improving alkali resistance, and Zr and Al for the purpose of improving alkali resistance.

The refractive index of the low refractive index layer 14b is preferably 1.20~1.60, and more preferably 1.30~1.50. Examples of the dielectric used in the low refractive index layer 14b include magnesium fluoride ($MgF_2$, refractive index 1.38), and the like.

The refractive index of the high refractive index layer 14a is preferably 2.00~2.60, and more preferably 2.10~2.45. Examples of dielectrics used in the high refractive index layer 14a include niobium pentoxide ($Nb_2O_5$, refractive index 2.33), titanium oxide ($TiO_2$, refractive index 2.33~2.55), tungsten oxide ($WO_3$, refractive index 2.2), cerium oxide ($CeO_2$, refractive index 2.2), tantalum pentoxide ($Ta_2O_5$, refractive index 2.16), zinc oxide (ZnO, refractive index 2.1), indium tin oxide (ITO, refractive index 2.06), zirconium oxide ($ZrO_2$, refractive index 2.2), and the like.

When it is desired to impart electrically conductive properties to the high refractive index layer 14a, for example, ITO or indium zinc oxide (IZO) can be selected.

For the optical functional layer 14, for example, it is preferable that niobium pentoxide ($Nb_2O_5$ and refractive index 2.33) be used as the high refractive index layer 14a, and that $SiO_2$ be used as the low refractive index layer 14b.

The film thickness of the low refractive index layer 14b may be in a range of 1 nm or greater and 200 nm or less, and may be appropriately selected according to a wavelength region requiring an anti-reflective function.

The film thickness of the high refractive index layer 14a may be, for example, in a range of 1 nm or greater and 200 nm or less, and is appropriately selected according to a wavelength region that requires an anti-reflective function.

The film thicknesses of the high refractive index layer 14a and the low refractive index layer 14b can be appropriately selected according to the design of the optical functional layer 14.

For example, in order from the adhesion layer 13 side, the high refractive index layer 14a of 5~50 nm, the low refractive index layer 14b of 10~80 nm, the high refractive index layer 14a of 20~200 nm, and the low refractive index layer 14b of 50~200 nm may be used.

Of the layers forming the optical functional layer 14, the low refractive index layer 14b is disposed on the antifouling layer 15 side. It is preferable that the low refractive index layer 14b of the optical functional layer 14 is in contact with the antifouling layer 15 because the anti-reflective performance of the optical functional layer 14 is improved.

The antifouling layer 15 is formed on the outermost surface of the optical functional layer 14 and prevents fouling of the optical functional layer 14. When applied to a touch panel or the like, the antifouling layer 15 suppresses wear of the optical functional layer 14 due to abrasion resistance.

The antifouling layer 15 of the present embodiment is formed from a vapor-deposited film obtained by vapor deposition of an antifouling material. In the present embodiment, the antifouling layer 15 is formed by vacuum deposition of a fluorine-based organic compound as an antifouling material on one surface of the low refractive index layer 14b constituting the optical functional layer 14. In the present embodiment, since the antifouling material contains a fluorine-based organic compound, an optical laminate 10 having even better friction resistance and alkali resistance is obtained.

As the fluorine-based organic compound constituting the antifouling layer 15, a compound including a fluorine-modified organic group and a reactive silyl group (for example, alkoxysilane) is preferably used. Examples of commercially available products include Optool DSX (manufactured by Daikin Industries, Ltd.), KY-100 series (manufactured by Shin-Etsu Chemical Co., Ltd.), and the like.

When a compound composed of a fluorine-modified organic group and a reactive silyl group (e.g., alkoxysilane) is used as a fluorine organic compound constituting the antifouling layer 15, and a low refractive index layer 14a of an optical functional layer 14 in contact with the antifouling layer 15 is composed of $SiO_2$, a silanol group as a skeleton of the fluorine organic compound and $SiO_2$ form a siloxane bond. Therefore, the adhesion between the optical functional layer 14 and the antifouling layer 15 is improved, which is preferable.

The optical thickness of the antifouling layer 15 may be in a range of 1 nm or greater and 20 nm or less, and is preferably in a range of 3 nm or greater and 10 nm or less. When the thickness of the antifouling layer 15 is 1 nm or greater, the abrasion resistance can be sufficiently ensured when the optical laminate 10 is applied to touch panels or the like. In addition, when the thickness of the antifouling layer 15 is 20 nm or less, the time required for vapor deposition can be shortened, and efficient production can be achieved.

The surface roughness Ra of the antifouling layer 15 varies depending on the application and configuration of the optical laminate. When the optical laminate is a transparent anti-reflective layer having no antiglare function, the surface roughness Ra of antifouling layer 15 is, for example, preferably 3 nm or greater. The upper limit is not particularly limited, but is, for example, preferably 9 nm or less from the perspective of scratch resistance.

The antifouling layer 15 may contain additives such as light stabilizers, ultraviolet absorbers, colorants, antistatic agents, lubricants, leveling agents, antifoaming agents, antioxidants, flame retardants, infrared absorbers, and surfactants, if necessary.

The antifouling layer 15 formed by vapor deposition is strongly bonded to the optical functional layer 14, has few voids, and is dense. As a result, the antifouling layer 15 of the present embodiment exhibits characteristics different from those of an antifouling layer formed by a conventional method such as application of an antifouling material.

For example, the antifouling layer 15 of the optical laminate 10 of the present embodiment has the following characteristics.

(1) The difference in contact angle with respect to water after scratch testing by horizontally reciprocating steel wool 500 times is 10° or less.
(2) The contact angle with respect to water after scratch testing by horizontally reciprocating steel wool 500 times is 110° or greater.
(3) The contact angle with respect to water after scratch testing by reciprocating a waste (non-woven fabric wiper) 4000 times is 100° or greater.
(4) The amount of change (ΔE value) in the L*a*b* value expressed by formula (2) below according to SCI (Specular Component Include, measurement method of reflected color taking into account specularly reflected light) before and after scratch testing by horizontally reciprocating steel wool 500 times is 3.0 or less.

$$\Delta E = \Delta(L^*a^*b^*) = \sqrt{(L1^*-L0^*)^2+(a1^*-a0^*)^2+(b1^*-b0^*)^2} \quad \text{Formula (2)}$$

(In formula (2), L0*, a0*, and b0* are values before scratch testing, and L1*, a1*, and b1* are values after scratch testing.)

(5) The amount of change (ΔE) in the L*a*b* value expressed by formula (3) below according to SCE (Specular Component Exclude, a measurement method of reflected color that does not take into account specularly reflected light) before and after scratch testing by horizontally reciprocating steel wool 500 times is 1.5 or less.

$$\Delta E = \Delta(L^*a^*b^*) = \sqrt{(L1^*-L0^*)^2+(a1^*-a0^*)^2+(b1^*-b0^*)^2} \quad \text{Formula (3)}$$

(In formula (3), L0*, a0*, and b0* are values before scratch testing, and L1*, a1*, and b1* are values after scratch testing.)
(6) The fluorine residue ratio measured by X-ray fluorescence analysis (XRF) after immersion for 4 hours in a NaOH solution having a concentration of 0.1 mol/L (solution temperature 55° C.) is 70% or more.

The optical laminate 10 provided with the antifouling layer 15 of the present embodiment formed by vapor deposition is more densely formed with fewer voids in comparison with the antifouling layer formed by coating. Furthermore, in the optical laminate 10 of the present embodiment, the antifouling layer 15 is firmly bonded to the low refractive index layer 14b in contact with the antifouling layer 15. Therefore, the optical laminate 10 of the present embodiment has excellent visible light transmittance, can maintain high abrasion resistance against repeated abrasion, and can maintain high resistance against alkali resistance.

[Method of Manufacturing an Optical Laminate]

The optical laminate 10 of the present embodiment illustrated in FIG. 3 can be manufactured, for example, by the following method.

In the present embodiment, as an example of the method for producing the optical laminate 10, a case is described in which the optical laminate 10 is manufactured using the transparent substrate 11 wound in a roll shape.

First, the transparent substrate 11 wound into a roll shape is unwound. Then, the transparent substrate 11 is coated with a slurry containing the material for forming the hard coat layer 12 by a known method, and cured by a known method corresponding to the material for forming the hard coat layer 12. As a result, the hard coat layer 12 is formed (hard coat layer forming step). Thereafter, the transparent substrate 11 having the hard coat layer 12 formed thereon is wound into a roll shape by a known method.

Next, an adhesion layer forming step of forming the adhesion layer 13 and an optical functional layer forming step of forming the optical functional layer 14 are performed on the hard coat layer 12. Thereafter, an antifouling layer forming step of forming the antifouling layer 15 on the optical functional layer 14 is performed. In the present embodiment, the adhesion layer forming step and the optical functional layer forming step are preferably performed after the first surface treatment step of treating the surface of the hard coat layer 12 is performed before the optical functional layer forming step. In addition, in the present embodiment, after the optical functional layer forming step, the antifouling layer forming step is preferably performed after the second surface treatment step of treating the surface of the anti-reflective layer is performed.

In the method for producing the optical laminate 10 according to the present embodiment, the first surface treatment step, the adhesion layer forming step, the optical functional layer forming step, the second surface treatment step, and the antifouling layer forming step are preferably performed continuously while maintaining the reduced pressure of the optical laminate during production. When the first surface treatment step, the adhesion layer forming step, the optical functional layer forming step, the second surface treatment step, and the antifouling layer forming step are performed continuously while maintaining the reduced pressure of the optical laminate being manufactured, for example, an apparatus including the thin film forming device described in Patent Literature 4 can be used as the sputtering device.

Figure 4:
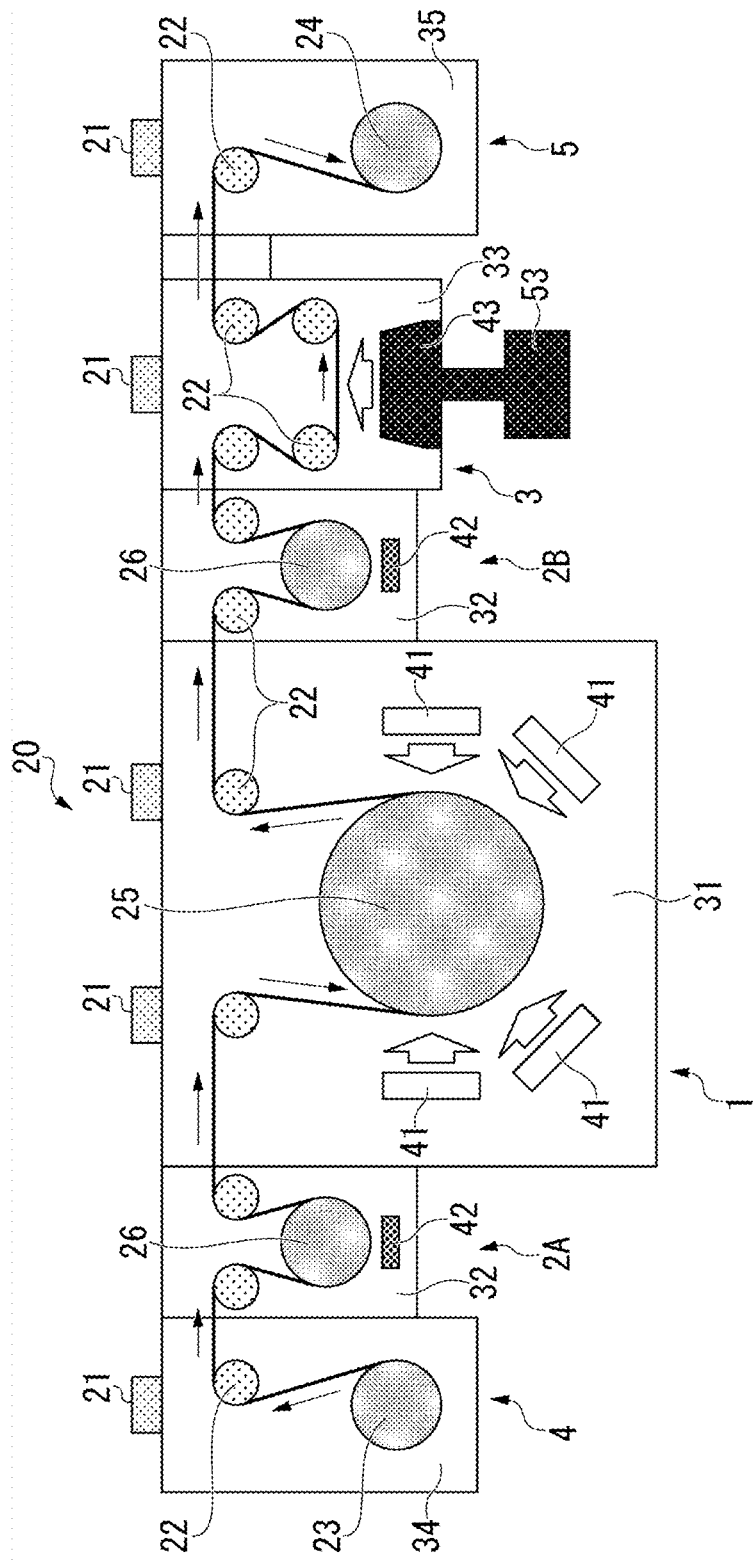
FIG. 4 is a schematic diagram for explaining an example of a manufacturing apparatus which can be used in the method of manufacturing an optical laminate according to the present embodiment.

A specific example of a manufacturing apparatus that can be used in the method of manufacturing an optical laminate according to the present embodiment is a manufacturing apparatus 20 illustrated in FIG. 4.

A manufacturing apparatus 20 illustrated in FIG. 4 includes a roll unwinding device 4, a pretreatment device 2A, a sputtering device 1, a pretreatment device 2B, a vapor deposition device 3, and a roll winding device 5. As shown in FIG. 4, the devices 4, 2A, 1, 2 B, 3, 5 are connected in this order. The manufacturing apparatus 20 illustrated in FIG. 4 is a roll-to-roll manufacturing apparatus that continuously forms a plurality of layers on a substrate by unwinding the substrate from a roll, continuously passing the substrate through a connected apparatus (in FIG. 4, the pretreatment device 2A, the sputtering device 1, the pretreatment device 2B, and the vapor deposition device 3), and then winding the substrate.

When the optical laminate 10 is manufactured using a roll-to-roll manufacturing apparatus, the transport speed (line speed) of the optical laminate 10 during production can be appropriately set. The transport speed is, for example, preferably 0.5~20 m/min, and more preferably 0.5~10 m/min.

<Roll Unwinding Device>

The roll unwinding device 4 illustrated in FIG. 4 includes a chamber 34 whose interior is set to a predetermined reduced pressure atmosphere, one or more vacuum pumps 21 (one in FIG. 4) configured to discharge gas in the chamber 34 to set the reduced pressure atmosphere, and an unwinding roll 23 and a guide roll 22 installed inside the chamber 34. As illustrated in FIG. 4, the chamber 34 is coupled to the chamber 31 of the sputtering device 1.

A transparent substrate 11 having a hard coat layer 12 formed on the surface thereof is wound around the unwinding roll 23. The unwinding roll 23 supplies the transparent substrate 11, on which the hard coat layer 12 is formed, to the pretreatment device 2A at a predetermined transport speed.

<Pretreatment Device 2A>

A pretreatment apparatus 2A illustrated in FIG. 4 includes a chamber 32 whose interior is set to a predetermined reduced pressure atmosphere, a can roll 26, a plurality of guide rolls 22 (two in FIG. 4), and a plasma discharge device 42. As illustrated in FIG. 4, the can roll 26, the guide roll 22, and the plasma discharge device 42 are disposed inside the chamber 32. As illustrated in FIG. 4, the chamber 32 is coupled to the chamber 31 of the sputtering device 1.

The can roll 26 and the guide roll 22 transport the transparent substrate 11 with the hard coat layer 12 formed thereon sent from the roll unwinding device 4 at a predetermined transport speed, and then send the transparent substrate 11 on which the surface of the hard coating layer 12 has been treated to the sputtering device 1.

As shown in FIG. 4, the plasma discharge device 42 is arranged to face the outer peripheral surface of the can roll 26 at a predetermined distance. The plasma discharge device 42 ionizes a gas by glow discharge. The gas is preferably an inexpensive, inert gas, and does not affect the optical characteristics, and for example, argon gas, oxygen gas, nitrogen gas, helium gas, or the like can be used. Argon gas is preferably used as the gas because it has a large mass, is chemically stable, and is readily available.

In the present embodiment, a glow discharge device that ionizes argon gas using high-frequency plasma is preferably used as the plasma discharge device 42.

<Sputtering Device>

The sputtering device 1 illustrated in FIG. 4 includes a chamber 31 whose interior is set to a predetermined reduced pressure atmosphere, one or a plurality of vacuum pumps 21 (two in FIG. 4) configured to discharge gas in the chamber 31 to set to the reduced pressure atmosphere, a film forming roll 25, a plurality of guide rolls 22 (two in FIG. 4), and a plurality of film forming units 41 (four in the example illustrated in FIG. 4). As illustrated in FIG. 4, a film forming roll 25, a guide roll 22, and film forming units 41 are installed in a chamber 31. As illustrated in FIG. 4, the chamber 31 is coupled to the chamber 32 of the pretreatment device 2B.

The film forming roll 25 and the guide roll 22 transport the transparent substrate 11 with the surface-treated hard coat layer 12 thereon sent from the pretreatment device 2A at a predetermined transport speed, and then send the transparent substrate 11 on which the adhesion layer 13 and the optical functional layer 14 are formed on the hard coat layer 12 to the pretreatment device 2B.

In the sputtering device 1 illustrated in FIG. 4, the adhesion layer 13 is laminated by sputtering on the hard coat layer 12 of the transparent substrate 11 traveling on the film forming roll 25, and the high refractive index layer 14a and the low refractive index layer 14b are alternately laminated thereon to form the optical functional layer 14.

As illustrated in FIG. 4, a plurality of film forming units 41 are arranged to face the outer peripheral surface of the film forming roll 25 at predetermined intervals, and surround the film forming roll 25. The number of film forming units 41 is determined according to the total number of layers of the adhesion layer 13, the high refractive index layer 14a and the low refractive index layer 14b that form the optical functional layer 14. In a case where the total number of laminated layers of the adhesion layer 13, the high refractive index layer 14a and the low refractive index layer 14b that form the optical functional layer 14 is large and it is difficult to secure a distance between adjacent film forming units 41, a plurality of film forming rolls 25 may be provided in the chamber 31, and the film forming units 41 may be disposed around each of the film forming rolls 25. When a plurality of film forming rolls 25 are provided, guide rolls 22 may be further provided, if necessary. A plurality of chambers 31 provided with the film forming rolls 25 and the film forming units 41 may be connected. Further, the diameter of the film forming roll 25 may be appropriately changed to facilitate securing the distance between adjacent film forming units 41.

A predetermined target (not illustrated) is provided in each of the film forming units 41. A voltage is applied to the target using a known structure. In the present embodiment, a gas supply unit (not illustrated) that supplies a predetermined reactive gas and a carrier gas to the target at a predetermined flow rate, and a known magnetic field generating source (not illustrated) that forms a magnetic field on the surface of the target are provided near the target.

The material of the target, and the type and flow rate of the reactive gas are appropriately determined according to the composition of the adhesion layer 13, the high refractive index layer 14a, and the low refractive index layer 14b formed on the transparent substrate 11 by passing between the film forming units 41 and the film forming roll 25. For example, when a layer formed from $SiO_2$ is formed, Si is used as the target, and $O_2$ is used as the reactive gas. In addition, for example, when a layer formed of $Nb_2O_5$ is formed, Nb is used as a target, and $O_2$ is used as a reactive gas.

In the present embodiment, from the viewpoint of speeding up the film forming speed, magnetron sputtering is preferably used as the sputtering method.

Note that the sputtering method is not limited to the magnetron sputtering method, and a bipolar sputtering method using plasma generated by direct current glow discharge or high frequency, a tripolar sputtering method in which a hot cathode is added, or the like may be used.

The sputtering device 1 includes an optical monitor (not illustrated) serving as a measurement unit for measuring optical characteristics after each layer serving as the adhesion layer 13 and the optical functional layer 14 is formed. As a result, the quality of the formed adhesion layer 13 and optical function layer 14 can be confirmed. When the sputtering apparatus 1 has, for example, two or more chambers, an optical monitor is preferably installed in each chamber.

Examples of the optical monitor (not illustrated) include an optical monitor that measures optical characteristics in the width direction of the adhesion layer 13 and the optical functional layer 14 formed on the hard coat layer 12 using an optical head capable of scanning in the width direction. When such an optical monitor is provided, the optical thickness distribution in the width direction of the adhesion layer 13 and the optical functional layer 14 can be measured, for example, by measuring the peak wavelength of reflectance as an optical characteristic and converting the peak wavelength into an optical thickness. By measuring the optical characteristics using an optical monitor, the optical laminate 10 including the contact layer 13 and the optical functional layer 14 having optimal optical characteristics can be formed while adjusting sputtering conditions in real time.

<Pretreatment Device 2B>

A pretreatment device 2B illustrated in FIG. 4 includes a chamber 32 whose interior is set to a predetermined reduced pressure atmosphere, a can roll 26, a plurality of guide rolls 22 (two in FIG. 4), and a plasma discharge unit 42. As illustrated in FIG. 4, the can roll 26, the guide roll 22 and the plasma discharge device 42 are disposed inside the chamber 32. As illustrated in FIG. 4, the chamber 32 is coupled to the chamber 33 of the vapor deposition device 3.

The can roll 26 and the guide roll 22 transport the transparent substrate 11 having the respective layers up to the optical functional layer 14 thereon sent from the sputtering device 1 at a predetermined transport speed, and then send the transparent substrate 11 in which the surface of the optical functional layer 14 is treated to the vapor deposition device 3.

As the plasma discharge device 42, for example, a device similar to that of the pretreatment device 2A can be used.

<Vapor Deposition Device>

The vapor deposition device 3 illustrated in FIG. 4 includes a chamber 33 whose interior is set to a predetermined reduced pressure atmosphere, one or more vacuum pumps 21 (one in FIG. 4) configured to discharge gas in the chamber 33 to set the reduced pressure atmosphere, a plurality of guide rolls 22 (four in FIG. 4), a vapor deposition source 43, and a heating device 53. As illustrated in FIG. 4, the guide roll 22 and the vapor deposition source 43 are installed in the chamber 33. The chamber 33 is coupled to the chamber 35 of the roll winding device 5.

The vapor deposition source 43 is arranged to face the transparent substrate 11, which is transported substantially horizontally between two adjacent guide rolls 22 and in which the surface of the optical functional layer 14 is treated. The vapor deposition source 43 supplies an evaporative gas composed of a material for forming the antifouling layer 15 onto the optical functional layer 14. The orientation of the vapor deposition source 43 can be arbitrarily set.

The heating device 53 heats the material for forming the antifouling layer 15 to the vapor pressure temperature. As the heating device 53, a resistance heating system, a heater heating system, an induction heating system, an electron beam system, or the like can be used. In the resistance heating system, a container containing the antifouling material for forming the antifouling layer 15 is electrically heated as a resistor. In the heater heating system, the container is heated by a heater disposed on the outer circumference of the container. In the induction heating system, the container or the antifouling material is heated by an electromagnetic induction action from an externally installed induction coil.

The vapor deposition device 3 illustrated in FIG. 4 includes a guide plate (not illustrated) that guides the vapor deposition material evaporated by the vapor deposition source 43 to a predetermined position, a film thickness gauge (not illustrated) that observes the thickness of the antifouling layer 15 formed by vapor deposition, a vacuum pressure gauge (not illustrated) that measures the pressure inside the chamber 33, and a power supply device (not illustrated).

The guide plate may have any shape as long as it is possible to guide the vaporized vapor deposition material to a desired position. The guide plate may not be provided if it is not necessary.

For example, an ion gauge or the like can be used as the vacuum pressure gauge.

Examples of the power supply device include a high-frequency power supply.

<Roll Winding Device>

The roll winding device 5 illustrated in FIG. 4 includes a chamber 35 whose interior is set to a predetermined reduced pressure atmosphere, one or more vacuum pumps 21 (one in FIG. 4) configured to discharge gas in the chamber 35 to set the reduced pressure atmosphere, and a winding roll 24 and a guide roll 22 installed inside the chamber 35.

A transparent base material 11 (optical laminate 10) in which each layer up to the antifouling layer 15 is formed on the surface thereof is wound on the surface of the winding roll 24. The winding roll 24 and the guide roll 22 wind the optical laminate 10 at a predetermined winding speed.

A carrier film may also be used, if necessary.

As the vacuum pump 21 provided in the manufacturing apparatus 20 illustrated in FIG. 4, for example, a dry pump, an oil rotary pump, a turbomolecular pump, an oil diffusion pump, a cryo pump, a sputter ion pump, a getter pump, or the like can be used. The vacuum pump 21 can be appropriately selected or used in combination in order to create the desired reduced pressure state in each of the chambers 31, 32, 33, 34, and 35.

As long as the vacuum pump 21 can maintain both the chamber 31 of the sputtering device 1 and the chamber 33 of the vapor deposition device 3 at a desired reduced pressure, the installation position and number of the vacuum pumps 21 in the manufacturing apparatus 20 are not particularly limited. Further, in a manufacturing apparatus 20 illustrated in FIG. 4, a roll unwinding device 4, a pretreatment device 2A, a sputtering device 1, a pretreatment device 2B, a vapor deposition device 3, and a roll winding device 5 are connected. Therefore, the vacuum pump 21 may be installed in each of the chambers 31, 32, 33, 34, and 35, or may be installed in only some of the chambers 31, 32, 33, 34, and 35, as long as both the chamber 31 of the sputtering device 1 and the chamber 33 of the vapor deposition device 3 can be maintained at a desired reduced pressure.

Next, a method of continuously performing the first surface treatment step, the adhesion layer forming step, the optical functional layer forming step, the second surface treatment step, and the antifouling layer forming step using the manufacturing apparatus 20 illustrated in FIG. 4 while maintaining the optical laminate 10 under reduced pressure during production will be described.

First, an unwinding roll 23 around which the transparent substrate 11 having the hard coat layer 12 formed on the surface thereof is wound is installed in the chamber 34 of the roll unwinding device 4. Then, the transparent substrate 11 having the hard coat layer 12 formed on the surface thereof is transported to the pretreatment device 2A at a predetermined transport speed by rotating the unwinding roll 23 and the guide roll 22.

Next, a first surface treatment step is performed in the chamber 32 of the pretreatment device 2A as pretreatment on the surface on which the adhesion layer 13 and the optical functional layer 14 are formed. In the present embodiment, the first surface treatment step is performed on the transparent substrate 11 on which the hard coat layer 12 is formed.

In the first surface treatment step, the surface of the hard coat layer 12 traveling on the can roll 26 is treated while the transparent substrate 11 on which the hard coat layer 12 is formed is transported at a predetermined transport speed by rotating the can roll 26 and the guide roll 22.

Examples of the surface treatment method of the hard coat layer 12 include glow discharge treatment, plasma treatment, ion etching, alkali treatment, and the like. Of these, the use of glow discharge treatment is preferable because large area treatment is possible. The glow discharge treatment can be performed at a treatment intensity of, for example, 0.1~10 kwh.

By performing the glow discharge treatment on the surface of the hard coat layer 12, the surface of the hard coat layer 12 is roughened on the nanolevel, and substances having weak bonding force present on the surface of the hard coat layer 12 are removed. As a result, adhesion between the hard coat layer 12 and the optical functional layer 14 formed on the hard coat layer 12 is improved.

Next, an adhesion layer forming step and an optical functional layer forming step are performed in the chamber 31 of the sputtering device 1. Specifically, the adhesion layer 13 and the optical functional layer 14 are formed on the hard coat layer 12 traveling on the film forming roll 25 while the transparent substrate 11 on which the hard coat layer 12 is formed is transported at a predetermined transport speed by rotating the film forming roll 25 and the guide roll 22.

In the present embodiment, an adhesion layer 13 is formed, and then a high refractive index layer 14a and a low refractive index layer 14b are alternately laminated on the adhesion layer 13, by sputtering while varying a target material prepared in each film forming unit 41, and the kind and flow rate of a reactive gas supplied from a gas supply unit. That is, the adhesion layer forming step and the optical functional layer forming step are performed sequentially in the sputtering device 1. As a result, the adhesion layer 13 and the optical functional layer 14 being an anti-reflective layer are formed.

When forming the SiOx film as the adhesion layer 13, the SiOx film is preferably formed by reactive sputtering in a mixed gas atmosphere of oxygen gas and argon gas using a silicon target.

When the adhesion layer 13, the high refractive index layer 14a, and the low refractive index layer 14b are sequentially laminated by sputtering, the target material may be changed between the time of film formation of the adhesion layer 13, the time of film formation of the high refractive index layer 14a, and the time of film formation of the low refractive index layer 14b. Furthermore, a layer comprising a target material and a layer comprising an oxide of the target material may be alternately laminated, for example, by using one kind of material as a target and changing a flow rate of oxygen (reactive gas) during sputtering to form the adhesion layer 13, the high refractive index layer 14a, and the low refractive index layer 14b.

The pressure at the time of sputtering for forming the adhesion layer 13 and the optical functional layer 14 varies depending on the metal to be sputtered, but may be 2 Pa or less, preferably 1 Pa or less, more preferably 0.6 Pa or less, and particularly preferably 0.2 Pa or less. When the pressure at the time of sputtering is reduced to 1 Pa or less, mean free pass of the film forming molecules is lengthened, and the film formation forming are stacked with a high energy, resulting in a dense and better film quality.

Thereafter, the transparent substrate 11 having the adhesion layer 13 and the optical functional layer 14 formed on the hard coat layer 12 is transported to the pretreatment device 2B by the rotation of the film forming roll 25 and the guide roll 22.

Next, a second surface treatment step is performed as a pretreatment on the surface on which the antifouling layer 15 is formed in the chamber 32 of the pretreatment device 2B. In the present embodiment, the second surface treatment step is continuously performed on the transparent substrate 11 on which the optical functional layer 14 obtained in the optical functional layer forming step is formed while maintaining the transparent substrate 11 under a reduced pressure without being brought into contact with the atmosphere.

In the second surface treatment step, the surface of the optical functional layer 14 traveling on the can roll 26 is subjected to electrical discharge treatment while the transparent substrate 11 having the respective layers up to the optical functional layer 14 thereon is transported at a predetermined transport speed by rotating the can roll 26 and the guide roll 22.

Examples of the method for surface treatment of the optical functional layer 14 include glow discharge treatment, plasma treatment, ion etching, alkali treatment and the like. Of these, the use of glow discharge treatment is preferable because large area treatment is possible.

When the surface of the optical functional layer 14 is subjected to electrical discharge treatment, the surface of the optical functional layer 14 is etched, and the roughness of the surface of the optical functional layer 14 changes. The roughness Ra of the surface of the optical functional layer 14 can be controlled by setting the integrated output during the electrical discharge treatment to be within an appropriate range. In the present embodiment, the integrated output is a value obtained by dividing the product of the glow discharge output and the irradiation time of irradiation of the optical functional layer 14 during the discharge treatment by the unit area.

The conditions of the discharge treatment can be set as appropriate. By appropriately setting the conditions of the discharge treatment, the adhesion between the optical functional layer 14 and the antifouling layer 15 formed thereon is improved, and an optical laminate 10 having even better friction resistance and alkali resistance is obtained.

The roughness Ra of the surface of the optical functional layer 14 after the electrical discharge treatment varies depending on the surface roughness of the hard coat layer 12 provided below the optical functional layer 14. Furthermore, the surface roughness Ra of the optical functional layer 14 after the electrical discharge treatment affects the surface roughness Ra of the antifouling layer 15 formed on the optical functional layer 14.

In the second surface treatment step, the surface of the optical functional layer is treated so that the rate of change of the surface roughness expressed by the following formula (1) becomes 1~25%.

Rate of change of surface roughness (%)=((Ra2/Ra1)−1)×100(%) Formula (1) (Formula (1), where Ra1 represents the surface roughness (Ra) of the optical functional layer before the surface thereof is treated, and Ra2 represents the surface roughness (Ra) of the optical functional layer after the surface thereof is treated.)

The second surface treatment step is preferably performed so that the rate of change of the surface roughness represented by formula (1) is 5% to 25%, more preferably 8% to 25%, more preferably 8% to 20%, more preferably 8% to 15%, and still more preferably 10% to 14%. When the change rate of the surface roughness represented by formula (1) is 1% or more, the effect of improving the adhesion between the optical functional layer 14 and the antifouling layer 15 by performing the second surface treatment step becomes remarkable. Further, when the rate of change of the surface roughness represented by formula (1) is 25% or less, the thickness of the optical functional layer 14 is appropriate, so that an antifouling layer 15 having a uniform thickness is formed on the optical functional layer 14.

In the present embodiment, the roughness Ra of the surface of the optical functional layer 14 can be measured by the method described below. Atomic force microscopy (AFM: Atomic Force Microscope) is used to measure the surface roughness Ra of the surface of the optical functional layer 14 in the range of 1 µm$^2$.

Thereafter, the transparent substrate 11 in which the surface of the optical functional layer 14 has been treated is sent to the vapor deposition device 3 by the rotation of the can roll 26 and the guide roll 22.

Next, the antifouling layer forming step is performed in the chamber 33 of the vapor deposition apparatus 3. In the present embodiment, the antifouling layer forming step is continuously performed on the transparent substrate 11 in which the surface of the optical functional layer 14 treated in the second surface treatment step while maintaining the transparent substrate 11 under a reduced pressure without contacting the transparent substrate 11 with air. In the antifouling layer forming step, the vapor deposition source 43 is vapor deposited onto the surface of the optical functional layer 14 while the transparent substrate 11 on which the surface of the optical functional layer 14 has been treated is transported at a predetermined conveyance speed by rotating the guide roll 22.

In the present embodiment, for example, an antifouling material made of a fluorine-based organic compound that will become the antifouling layer 15 is heated to a vapor pressure temperature by the heating device 53, the obtained evaporative gas is supplied from the vapor deposition source 43 in a reduced pressure environment, and the antifouling layer 15 is formed by vacuum vapor deposition. The pressure at the time of vacuum deposition of the antifouling layer 15 is, for example, preferably 0.05 Pa or less, more preferably 0.01 Pa or less, and particularly preferably 0.001 Pa or less. When the pressure at the time of vacuum vapor deposition is reduced to 0.05 Pa or less, mean free pass of film forming molecules is long, and the vapor deposition energy is high, and as a result, a dense and better antifouling layer 15 can be obtained.

According to the method described above, the optical laminate 10 in which the antifouling layer 15 is formed by vacuum deposition on the adhesion layer 13 and the optical functional layer 14 formed by sputtering is obtained.

Thereafter, the transparent substrate 11 (optical laminate 10) on which the layers up to the antifouling layer 15 are formed is sent to the roll winding device 5 by the rotation of the guide roll 22. The optical laminate 10 is wound around the winding roll 24 by the rotation of the winding roll 24 and the guide roll 22 in the chamber 35 of the roll winding device 5.

In the present embodiment, the optical functional layer forming step and the antifouling layer forming step are preferably performed sequentially under reduced pressure. In particular, when the optical laminate 10 is continuously manufactured as a roll by a roll-to-roll process, as in the manufacturing method of the present embodiment using the manufacturing apparatus 20 illustrated in FIG. 4, it is more preferable to continuously perform the optical functional layer forming step and the antifouling layer forming step in-line with the reduced pressure maintained. "In-line" means that the antifouling layer forming step is performed without bringing the optical functional layer 14 formed in the optical functional layer forming step into contact with the atmosphere. By sequentially performing the optical functional layer forming step and the antifouling layer forming step under reduced pressure, formation of a natural oxide film on the optical functional layer 14 formed in the optical functional layer forming step is suppressed before the antifouling layer 15 is formed. In addition, contamination such as foreign matters when winding the roll can be prevented from adhering to the optical functional layer 14 and inhibiting adhesion between the optical functional layer 14 and the antifouling layer 15. Therefore, an optical laminate having excellent adhesion between the optical functional layer 14 and the antifouling layer 15 and excellent transparency can be obtained as compared to a case where, after the optical functional layer forming step, the transparent substrate 11 in which the layers up to the optical functional layer 14 are formed is taken out from the chamber in a reduced pressure state, then placed in the chamber again, and the antifouling layer forming step is performed under reduced pressure.

In addition, since the antifouling layer 15 of the optical laminate 10 of the present embodiment is a vapor-deposited film, the antifouling layer 15 can achieve higher abrasion resistance than, for example, an antifouling layer formed by a coating method. This is estimated to be due to the following reasons. That is, voids originating from the solvent contained in the coating are present in the antifouling layer formed by the coating method. In contrast, voids caused by the solvent are not present in the vapor-deposited film. Therefore, it is presumed that the vapor-deposited film is dense and provides high abrasion resistance and alkali resistance compared to the antifouling layer formed by the coating method.

The method of manufacturing the optical laminate 10 of the present embodiment includes an adhesion layer forming step of forming an adhesion layer 13, an optical functional layer forming step of forming an optical functional layer 14 by alternately laminating the high refractive index layer 14$a$ and the low refractive index layer 14$b$, a second surface treatment step of treating the surface of the optical functional layer 14 and an antifouling layer forming step of forming an antifouling layer 15 on the surface-treated optical functional layer 14. Therefore, adhesion between the optical functional layer 14 and the antifouling layer 15 formed on the optical functional layer 14 is improved, and friction resistance and alkali resistance are further favorable.

In particular, in the second surface treatment step, when the surface of the optical functional layer is treated such that the rate of change in surface roughness expressed by formula (1) becomes 1~25%, the surface of the optical functional layer 14 changes to an appropriate roughness and is etched to activate the surface, which is preferable because reactivity with the antifouling layer 15 formed on the optical functional layer 14 is improved.

Furthermore, in the method of manufacturing the optical laminate 10 according to the present embodiment, since the optical laminate 10 can be continuously formed by a roll-to-roll process and the film thickness can be controlled with high precision, the optical functional layer 14 is preferably formed by sputtering in the step of forming an optical functional layer.

In the present embodiment, when the first surface treatment step, the optical functional layer forming step, the second surface treatment step, and the antifouling layer forming step are performed continuously while the optical laminate being manufactured is maintained in a reduced pressure state, the reduced pressure conditions in the chamber may be different, for example, between the sputtering device and the vapor deposition device, as long as the conditions are within a range that does not hinder each manufacturing step.

In the present embodiment, in any one or more of the adhesion layer forming step, the optical functional layer forming step, and the antifouling layer forming step, it is preferable that the film formation result is measured with a measuring instrument over time, and the result is fed back to the conditions of the manufacturing steps corresponding to the subsequent steps. This makes it easier to optimize the characteristics of the entire optical laminate and makes it possible to make the in-plane characteristics of the optical laminate uniform. In addition, the manufacturing conditions in the same step can be fed back by the measuring instrument. In this case, the layer formed in this step has uniform and stable characteristics.

In the present embodiment, an example is given of a case in which the second surface treatment step is performed between the optical functional layer forming step and the antifouling layer forming step, but the second surface treatment step may or may not be performed as necessary. Even when the second surface treatment step is not performed, the optical functional layer forming step and the antifouling layer forming step are preferably performed sequentially under reduced pressure.

In the present embodiment, using a manufacturing apparatus 20 illustrated in FIG. 4, which is provided with a pretreatment device 2A, a sputtering device 1, a pretreatment device 2B, a vapor deposition device 3, a roll unwinding device 4, and a roll winding device 5, a case in which the optical laminate 10 is continuously manufactured by a roll-to-roll process is described as an example, but the manufacturing apparatus for manufacturing the optical laminate 10 is not limited to the production apparatus 20 illustrated in FIG. 4.

For example, a manufacturing device that does not include the pretreatment device 2A and the pretreatment device 2B and in which the roll unwinding device 4, the sputtering device 1, the vapor deposition device 3, and the roll winding device 5 are connected in this order may be used.

In a manufacturing apparatus 20 illustrated in FIG. 4, a pretreatment chamber (not illustrated) for cleaning the surface of the optical functional layer 14 having the antifouling layer 15 is formed thereon may be provided between the chamber 33 of the vapor deposition device 3 and the chamber 32 of the pretreatment device 2B.

In the manufacturing apparatus 20 illustrated in FIG. 4, a post-treatment chamber (not illustrated) for cooling and/or inspecting the transparent substrate 11 on which the layers up to the antifouling layer 15 are formed may be provided between the chamber 33 of the vapor deposition device 3 and the chamber 35 of the roll winding device 5.

In the manufacturing apparatus 20 illustrated in FIG. 4, a hard coat layer forming device for forming a hard coat layer 12 on the surface of the transparent substrate 11 may be provided between the roll unwinding device 4 and the sputtering device 1. In this case, not only the optical functional layer 14 and the antifouling layer 15, but also the hard coat layer 12 can be continuously manufactured by a roll-to-roll process, which is preferable.

In the present embodiment, an example is given of a case in which the optical functional layer forming step is performed using a sputtering device and the antifouling layer forming step is performed using a vapor deposition device. However, when the second surface treatment step is not performed, the optical functional layer forming step and the antifouling layer forming step may be performed in the same device (in one chamber).

In the optical laminate 10 of the present embodiment, various layers may be provided on the surface opposite to the surface of the transparent substrate on which the optical functional layer or the like is formed as necessary. For example, a pressure-sensitive adhesive layer used for adhering to other members may be provided. In addition, another optical film may be provided via the pressure-sensitive adhesive layer. Examples of other optical films include polarizing films, phase difference compensation films, films that function as ½ wave plates, ¼ wave plates, and the like.

Furthermore, a layer having functions such as anti-reflection, selective reflection, antiglare, polarization, phase difference compensation, viewing angle compensation or enlargement, light guiding, diffusion, brightness enhancement, hue adjustment, conductivity, and the like may be directly formed on the opposing surface of the transparent substrate.

In addition, the shape of the optical laminate may be a smooth shape, or may be a shape having a nano-order recessing and protruding structure that exhibits moth-eye and antiglare function. In addition, the geometric shape may be on the order of micrometer to millimeter, such as lenses and prisms. The shape can be formed by, for example, a combination of photolithography and etching, shape transfer, heat pressing, and the like. In the present embodiment, the film is formed by vapor deposition or the like, and thus the concavo-convex shape can be maintained even when, for example, the substrate has a concavo-convex shape.

An article of the present embodiment is obtained by providing the optical laminate 10 described above on a display surface of an image display unit, such as a liquid crystal display panel or an organic EL display panel. Thus, for example, high abrasion resistance and alkali resistance can be imparted to a touch panel display unit of a smartphone or an operation device, and an image display device suitable for actual use can be achieved.

In addition, the article is not limited to an image display device, and any article may be used as long as the optical laminate 10 is applicable, for example, a window glass, goggles, a light receiving surface of a solar cell, a screen of a smart phone, a personal computer display, an information input terminal, a tablet terminal, an AR (augmented reality) device, an VR (virtual reality) device, an electronic display plate, a glass table surface, a game machine, an operation support device for an aircraft or a train, a navigation system, an instrument panel, an optical sensor, or the like, in which the optical laminate of the present embodiment is provided on the surface thereof.

Embodiments of the present invention have been described above, but these embodiments have been presented by way of example and are not intended to limit the scope of the invention. The exemplary embodiment can be implemented in various other forms, and various omissions, substitutions, and changes can be made without departing from the gist of the invention. These embodiments and modifications are also included within the spirit and scope of the invention, as well as within the invention described in the claims and the scope of equivalents thereof.

For example, instead of the hard coat layer 12, an antiglare layer can be formed, or any functional layer can be added as necessary, such as a soft coat layer having flexibility. These may be laminated.

EXAMPLES

The effect of the present invention was verified.

Note that the optical laminate manufactured in the following examples and comparative examples is an example that functions as an anti-reflective film, and the spirit of the present invention is not limited thereto.

Examples 1 to 5, Comparative Example 2

First, a photocurable resin composition was prepared in which the content of silica particles (filler) having an average particle size of 50 nm was 28 mass % relative to the total solid content of the resin composition (binder resin). As shown in Table 1, the resin compositions were prepared by dissolving the silica particles, the acrylate, the leveling agent, and the photopolymerization initiator in a solvent.

coat layer 12 was formed by the method described below by the roll-to-roll method to produce optical laminate (anti-reflective film) of Examples 1 to 5, Comparative Example 2.

The manufacturing apparatus 20 illustrated in FIG. 4 was used as the manufacturing apparatus. The line speed was 2 m/min. The first surface treatment step, the adhesion layer forming step, the optical functional layer forming step, the second surface treatment step, and the antifouling layer forming step were performed continuously while maintaining the reduced pressure of the optical laminate during production.

<First Surface Treatment Step>

Next, the glow discharge treatment was performed on the hard coat layer 12 at a glow discharge treatment intensity of 4000 W·min/m².

<Adhesion Layer Forming Step and Optical Functional Layer Forming Step>

An adhesion layer 13 made of SiOx with a thickness of 5 nm is formed on the hard coat layer 12 after the glow discharge treatment by sputtering in a chamber having a pressure of 1.0 Pa or less, and an optical functional layer 14 (laminate), consisting of an $Nb_2O_5$ film (high refractive index layer) with a thickness of 15 nm, a $SiO_2$ film (low refractive index layer) with a thickness of 38 nm, a $Nb_2O_5$ film (high refractive index layer) with a thickness of 30 nm, and a $SiO_2$ film (low refractive index layer) with a thickness of 102 nm, is formed on the adhesion layer 13.

<Second Surface Treatment Step>

The surface of the optical functional layer 14 was subjected to glow discharge treatment. Table 2 shows the integrated output of the glow discharge treatment. Table 2 shows relative values (relative output values) where the integrated output of the glow discharge process of Example 1 is 100. In Example 1, the integrated output of the glow discharge treatment was 326 W min/m².

TABLE 1

|  | Product name | Manufacturer | Structure | Blend ratio |
|---|---|---|---|---|
| Acrylate | CN968 | Sartomer | Urethane acrylate oligomer | 8% |
|  | SR444 | Sartomer | Pentaerythritol triacrylate | 7% |
|  | SR610 | Sartomer | Polyethylene glycol (600) diacrylate | 11% |
| Silica particles | IPA-ST-L | Nissan Chemical | Silica sol with particle size of 40 to 50 nm (solid fraction: 30%, solvent: IPA) | 37% |
| Initiator | Irgacure 184 | BASF | Initiator | 2% |
| Solvent | PGMA |  | Propylene glycol monomethyl ether acetate | 30% |
|  | Butyl acetate |  |  | 5% |
| Total |  |  |  | 100% |
| Leveling agent | BYK377 | BYK | Polyether-modified polydimethylsiloxane | 0.01 parts by weight per 100 parts by weight of the above total |

SR610: polyethylene glycol diacrylate, average molecular weight of polyethylene glycol chain 600

CN968: hexafunctional aliphatic urethane acrylate having polyester skeleton

Irgacure184: 1-hydroxy-cyclohexyl-phenyl-ketone

<Hard Coat Layer Forming Step>

A roll-shaped TAC film having a thickness of 80 μm and a length of 3900 m was prepared as the transparent substrate 11, and the photocurable resin composition shown in Table 1 was applied to the TAC film using a gravure coater and cured by irradiation with light to form a hard coat layer 12 having a thickness of 5 μm.

Next, the adhesion layer 13, the optical functional layer 14 and the antifouling layer 15 were continuously formed in this order on the transparent substrate 11 on which the hard Table 2 shows the rate of change of surface roughness represented by the following formula (1).

Rate of change of surface roughness $(\%) = ((Ra2/Ra1) - 1) \times 100 (\%)$ Formula (1) (Formula (1), where Ra1 represents the surface roughness (Ra) of the optical functional layer before the surface thereof is treated, and Ra2 represents the surface roughness (Ra) of the optical functional layer after the surface thereof is treated.)

<Antifouling Layer Forming Step>

Next, an antifouling layer composed of an alkoxysilane compound (KY-1901, manufactured by Shin-Etsu Chemical Co., Ltd.) having a perfluoropolyether group, which is an organic compound having fluorine, was formed on the optical functional layer 14 by vapor deposition under a pressure inside a vapor deposition chamber of 0.01 Pa or less, at a vapor deposition temperature of 230° C., and at a line speed of 2.0 m/min. The optical film thickness of the obtained antifouling layer 15 is shown in Table 2.

Thereafter, the film was wound into a roll shape to obtain the optical laminate (anti-reflective film) of Example 1.

(Measurement of Surface Roughness Ra of Antifouling Layer)

A measurement sample of 50 mm×50 mm was cut out from a position in the center in the length direction and a position in the center in the roll width direction of each roll wound with the optical laminate. The surface of the sample was observed using an Atomic Force Microscope (Product

TABLE 2

|  |  |  | Example 1 | Example 2 | Example 3 | Example 4 | Example 5 | Comparative Example 1 | Comparative Example 2 | Comparative Example 3 |
|---|---|---|---|---|---|---|---|---|---|---|
|  | Transparent substrate | | TAC film | TAC film | TAC film | TAC film | TAC film | TAC film | TAC film | TAC film |
|  | Relative output values of discharge treatment | | 100 | 100 | 100 | 233 | 333 | 0 | 1000 | No discharge treatment (application) |
|  | Optical film thickness (nm) | | 5.0 | 4.0 | 3.0 | 5.0 | 5.0 | 5.0 | 5.0 | 7 |
|  | Antifouling layer Ra (nm) | | 7.9 | 6.3 | 7.0 | 7.8 | 7.2 | 5.1 | 8.6 | 2.3 |
|  | Rate of change in surface roughness Ra before and after surface treatment (%) | | 10 | 10 | 10 | 12 | 14 | — | 30 | — |
| Initail state | Contact angle (°) | Pure water | 120 | 120 | 120 | 120 | 120 | 120 | 120 | 114 |
|  |  | Oleic acid | 84 | — | — | — | — | — | — | — |
|  |  | N-hexadecane | 73 | — | — | — | — | — | — | — |
|  |  | diiodomethane | 93 | — | — | — | — | — | — | — |
|  | ESCA | Amount of fluorine | 210517 | 212170 | 193200 | — | — | — | — | 200218 |
|  | XRF | Amount of fluorine | 0.0474 | 0.0400 | 0.0396 | 0.0513 | 0.0507 | 0.0570 | 0.0528 | 0.0579 |

Comparative Example 1

An optical laminate (anti-reflective film) of Comparative Example 1 was prepared in the same manner as in Example 1, except that the antifouling layer 15 was formed on the optical functional layer 14 by performing the antifouling layer forming step without performing the surface treatment step after performing the optical functional layer forming step in the same manner as in Example 1.

Comparative Example 3

After the optical functional layer forming step was performed in the same manner as in Example 1, the TAC film on which the hard coat layer 12, the adhesion layer 13, and the optical functional layer 14 were formed was wound and taken out from the manufacturing apparatus, and installed in a roll-to-roll type coating apparatus (coater). Thereafter, the TAC film in which the hard coat layer 12, the adhesion layer 13 and the optical function layer 14 were formed was unwound under atmospheric pressure, and an antifouling agent was applied onto the SiO₂ film (low refractive index layer) of the optical function layer 14 using a gravure coater at a line speed of 20 m/min.

As the antifouling agent, an alkoxysilane compound having a perfluoropolyether group (KY-1901, manufactured by Shin-Etsu Chemical Co., Ltd.) diluted with a fluorine solvent (Fluorinert FC-3283, manufactured by 3M Japan Co., Ltd.) to a concentration of 0.1 mass % was used. The antifouling agent was applied so that the film thickness after drying was as shown in Table 2.

The resulting optical laminates (antireflection films) of Examples 1 to 5 and Comparative Examples 1 to 3 were examined for surface roughness Ra of the antifouling layers by the following methods. The results are shown in Table 2.

name: SPA 400, NanoNaviII, manufactured by Hitachi, Ltd.), and the surface roughness Ra in the area of 1 μm² was measured.

The surface roughness Ra of the antifouling layer is affected by the surface roughness Ra of the underlying optical functional layer. In particular, in the antifouling layer formed by vapor deposition, unlike the antifouling layer formed by the coating method, there is no void caused by the solvent contained in the coating material, and the antifouling layer is formed at a high density, so that the effect of the surface roughness Ra of the underlying optical functional layer is greater than that of the antifouling layer formed by the coating method. The surface of the optical functional layer is subjected to glow discharge treatment to increase the surface roughness, and the surface roughness of the antifouling layer is increased by the influence of the glow discharge treatment. When the optical functional layer is exposed to the atmosphere, a natural oxide film is formed on the optical functional layer, and the surface roughening effect by the glow discharge treatment is reduced, but when the optical functional layer and the antifouling layer are formed without being exposed to the atmosphere, such an effect is not felt. The difference in surface roughness between Example 1 and Comparative Example 1 is caused by the presence or absence of glow discharge treatment.

The characteristics of the optical laminates (anti-reflective films) of Examples 1 to 5 and Comparative Examples 1 to 3 were examined. The results are shown in Tables 2 to 4. The test pieces used for measuring the characteristics of Examples 1 to 5 and Comparative Examples 1 to 2 were cut out from the vicinity of the substantially center in the longitudinal direction of the roll in which the optical laminate was wound.

TABLE 3

| | | | Example 1 | Example 2 | Examle 3 | Example 4 |
|---|---|---|---|---|---|---|
| Waste scratchability test | Pure water contact angle (°) | Reciprocation 0 times | 120 | 120 | 120 | 120 |
| | | Reciprocation 500 times | 120 | 120 | 117 | 120 |
| | | Reciprocation 1000 times | 120 | 117 | 114 | 120 |
| | | Reciprocation 2000 times | 120 | 114 | 111 | 120 |
| | | Reciprocation 4000 times | 119 | 111 | 108 | 120 |
| | | Contact angle difference | 1 | 9 | 12 | 0 |
| | ESCA Amount of fluorine | Before test | 210517 | 212170 | 193200 | 240275 |
| | | After test | 209800 | — | — | 187210 |
| | | Residue ratio | 99.4% | — | — | 77.9% |
| Alkali resistance test | Hue change | ΔE(SCI) | 0.8 | 2.3 | 3.6 | 2.9 |
| | ESCA Amount of fluorine | Before test | 201884 | — | — | — |
| | | After test | 198891 | — | — | — |
| | | Residue ratio | 98.5% | — | — | — |
| | XRF Amount of fluorine | Before test | 0.0474 | 0.0400 | 0.0396 | 0.0513 |
| | | After test | 0.0433 | 0.0387 | 0.0377 | 0.043 |
| | | Residue ratio | 91.4% | 96.8% | 95.2% | 83.8% |

| | | | Example 5 | Comparative Example 1 | Comparative Example 2 | Comparative Example 3 |
|---|---|---|---|---|---|---|
| Waste scratchability test | Pure water contact angle (°) | Reciprocation 0 times | 120 | 120 | 120 | 114 |
| | | Reciprocation 500 times | 119 | 110 | 112 | 114 |
| | | Reciprocation 1000 times | 118 | 108 | 111 | 112 |
| | | Reciprocation 2000 times | 113 | 103 | 108 | 101 |
| | | Reciprocation 4000 times | 109 | 103 | 105 | 94 |
| | | Contact angle difference | 1 | 17 | 15 | 20 |
| | ESCA Amount of fluorine | Before test | 240138 | 221656 | 240258 | — |
| | | After test | 174074 | 154836 | 157374 | — |
| | | Residue ratio | 72.5% | 69.9% | 65.5% | — |
| Alkali resistance test | Hue change | ΔE(SCI) | 3.5 | 13.3 | 6.3 | 36.7 |
| | ESCA Amount of fluorine | Before test | — | — | — | — |
| | | After test | — | — | — | — |
| | | Residue ratio | — | — | — | — |
| | XRF Amount of fluorine | Before test | 0.0507 | 0.0570 | 0.0528 | 0.0579 |
| | | After test | 0.0464 | 0.0108 | 0.0025 | 0.0100 |
| | | Residue ratio | 91.5% | 18.9% | 4.7% | 17.3% |

TABLE 4

| | | | Example 1 | Example 2 | Example 3 | Comparative Example 1 |
|---|---|---|---|---|---|---|
| Steel wool scratchability test | Pure water contact angle (°) | Reciprocation 0 times | 120 | 118 | 121 | 117 |
| | | Reciprocation 250 times | 114 | — | — | 105 |
| | | Reciprocation 500 times | 112 | 109 | 109 | 99 |
| | | Contact angle difference | 7 | 9 | 12 | 18 |
| | Hue change | ΔE(SCI) | 2.4 | — | — | — |
| | | ΔE(SCE) | 0.5 | — | — | — |

(1) Contact Angle (Antifouling Property)

(1-1) Contact Angle Measurement Test for Pure Water

The contact angle was measured by elliptical fitting under the following conditions using a fully automatic contact angle meter DM-700 (manufactured by Kyowa Interface Chemical Co., Ltd.). Distilled water was placed in a glass syringe, a stainless steel needle was attached to the tip of the glass syringe, and pure water was dropped onto the optical laminates (test pieces) of Examples 1 to 4 and Comparative Examples 1 to 3.

Drop quantity of pure water: 2.0 μL

Measurement temperature: 25° C.

Pure water was added dropwise thereto, and the contact angles were measured at six discretionary locations on the surface of the test piece after 4 seconds, and the average value thereof was taken as the pure water contact angle.

(1-2) Contact Angle Measurement Test for Oleic Acid, N-Hexadecane, and Diiodomethane (Reagent)

The contact angle measurement was performed by elliptical fitting under the following conditions using a fully automatic contact angle meter DM-700 (manufactured by Kyowa Interface Chemical Co., Ltd.). Each of the reagents described above was placed in a glass syringe, a stainless steel needle was attached to the tip thereof, and each of the reagents was dripped onto the optical laminate (test piece) of Example 1 and Comparative Example 1.

Drop quantity of pure water: 2.0 μL
Measurement temperature: 25° C.

Each of the reagents was added dropwise thereto, and the contact angles were measured at ten discretionary locations on the surface of the test piece after 4 seconds, and the average value thereof was taken as each contact angle for oleic acid, n-hexadecane, and diiodomethane.

(2) Fluorine Content Measurement Test

The amount of fluorine (cps: counts per unit time) of the optical laminates (test pieces) of Examples 1 to 5 and Comparative Examples 1 to 3 was measured (fluorine amount before cleaning (initial fluorine amount)).

The amount of fluorine was measured using an X-ray photoelectron spectrometer (Electron Spectroscopy for Chemical Analysis, ESCA) (PHI 5000 VersaProb * eIII, manufactured by Alvac Phi Corporation) and X-ray fluorescence spectrometry (X-ray fluorescence analysis, XRF) (EDX-8000, manufactured by Shimadzu Corporation). The fluorine value (cps) obtained by the X-ray photoelectron spectrometer and X-ray fluorescence spectrometry is the average value calculated from the result obtained by measuring n=3 in the initial state and n=15 after the alkali resistance test.

(3) Alkali Resistance Test

The optical laminates (test pieces) of Examples 1 to 5 and Comparative Examples 1 to 3 were measured (samples before treatment).

Next, a sodium hydroxide aqueous solution (reagent) with a concentration of 0.1 mol/L was prepared.

Then, a cylindrical member with an inner diameter of 38 mm was adhered to the optical laminates (test pieces) of Examples 1 to 5 and Comparative Examples 1 to 2, a reagent was dropped into the cylindrical member, and the upper surface opening was covered with a glass plate. Then, after being left to stand for 4 hours while maintaining the temperature at 55° C., each test piece was washed with distilled water to obtain a treated sample.

(3-1) Optical Characterization Measurement (Hue Change)

The backside of the sample before treatment and the backside of the sample after treatment were adhered to the black acrylic plate with a transparent tape to eliminate backside reflection. Then, the optical characteristics were measured.

An integrating sphere spectrophotometer (SP-64, manufactured by X-rite Co., Ltd.) was used for the optical measurement. The setting was a D 65 light source and 10°, and the ΔE value, which is the amount of change in the L*a*b* (according to CIE 1976) value shown by the above formula (2) by the SCI (Specular Component Include, a method for measuring reflected color that takes specular light into account) of the pre-treatment sample and the post-treatment sample, was calculated.

(3-2) Measurement Test of Fluorine Residue in Alkaline Solution

In the same manner as in the above test (2), the amount of fluorine (cps) of the sample after the treatment with the alkaline solution was measured using ESCA or XRF, and the residual rate (%) of fluorine in the sample after the treatment was calculated.

(4) Scratchability Test Using Steel Wool

Using a friction tester type I prescribed in JIS L0849, test pieces were obtained by moving a friction body horizontally back and forth across the surface of the optical laminates (test pieces) of Example 1 and Comparative Example 2.

A steel wool (number #0000, manufactured by BON-STAR Co., Ltd.) was used as the friction body. The test settings were a load of 1000 g/cm$^2$, a stroke of 75 mm, and a speed of 7 mm/s. Table 4 shows the number of horizontal reciprocations of the friction body.

(4-1) Contact Angle

In the same manner as in the above test (1-1), the contact angle of the test piece after friction was measured, and the contact angle difference between the test piece before friction and the test piece after friction after horizontal reciprocation 500 times was obtained. The test was conducted within 30 minutes after friction.

(4-2) Optical Characteristic Measurement (Hue Change)

In the same manner as in the above-described test (3-1), the ΔE value, which is the amount of change in the ΔL*a*b* value due to the SCI of the test piece before friction and after friction after 500 horizontal reciprocating movements, was calculated.

Further, in the same manner as in the test of (3-1) described above, the ΔE value, which is the amount of change in the ΔL*a*b* value shown by the above formula (3) by SCE (Specular Component Exclude, a method for measuring reflected color that does not take specular light into account) of the test piece before friction and the test piece after friction after horizontal reciprocating motion 500 times, was calculated.

(5) Scratchability Test Using Waste (Non-Woven Fabric Wiper)

A waste (non-woven fabric wiper) (Bemcot Lint-Free CT-8, manufactured by Asahi Kasei Corporation) were used as the friction body, and the scratchability test was performed in the same manner as the scratchability test using steel wool. The test settings were a load of 250 g/cm$^2$, a stroke of 25 mm, and a speed of 50 mm/s. Table 3 shows the number of horizontal reciprocating motions of the friction body.

(5-1) Contact Angle

In the same manner as in the above test (1-1), the contact angle of the test piece after friction was measured, and the contact angle difference between the test piece before friction and the test piece after friction after horizontal reciprocation 4000 times was obtained. The test was performed within 30 minutes after friction.

(5-2) Fluorine Residue Amount Measurement Test

In the same manner as in the above test (2), the amount of fluorine (cps) in the treated sample after 4000 horizontal reciprocating movements using a waste was measured using ESCA, and the residual rate (%) of fluorine in the treated sample was calculated.

As shown in Tables 2 to 4, the optical laminate of Examples 1 to 5, in which the surface treatment step of treating the surface of the optical functional layer 14 and the antifouling layer forming step of forming the antifouling layer 15 on the surface-treated optical functional layer 14 were performed, had a higher residual rate of fluorine in the alkali resistance test and a smaller hue change ΔE of 5 or less, compared with Comparative Example 1, in which the surface treatment step was not performed, and it was confirmed that the optical laminate had good alkali resistance.

Compared with Comparative Examples 1 and 2, the optical laminates of Examples 1 to 5 had a smaller contact angle difference of 14 or less in the scratchability test using waste (non-woven fabric wiper) and a higher residual rate of fluorine.

Compared with Comparative Examples 1 and 2, the optical laminates of Examples 1 to 5 had a smaller change in hue in the alkali resistance test and a higher residual rate of fluorine.

Compared with Comparative Example 3, the optical laminates of Examples 1 to 5 had a smaller contact angle difference of 14 or less in a scratch property test using wes (nonwoven fabric wiper), a smaller hue change in an alkali resistance test, and a higher residual rate of fluorine.

DESCRIPTION OF THE REFERENCE SIGNS 10, 101, 012: optical laminate
11: transparent substrate
12: hard coat layer
13: adhesion layer
14: optical functional layer
14a: high refractive index layer
14b: low refractive index layer
15: antifouling layer
20: manufacturing apparatus
1: sputtering device
2A, 2B: pretreatment device
3: vapor deposition device
4: roll unwinding device
5: roll winding device
21: vacuum pump
22: guide roll
23: unwinding roll
24: winding roll
25: film forming roll
26: can roll
31, 32, 33, 34, 35: chamber
41: film forming unit
42: plasma discharge unit
43: vapor deposition source
53: heating device

The invention claimed is:

1. A method of manufacturing an optical laminate comprising a transparent substrate, a hard coat layer, an adhesion layer, an optical functional layer, and an antifouling layer having a surface roughness Ra of 3 nm or greater and 9 nm or less, which are laminated in this order, the method comprising:
a hard coat layer forming step of forming the hard coat layer
an adhesion layer forming step of forming the adhesion layer,
an optical functional layer forming step of forming the optical functional layer,
a surface treatment step of performing glow discharge treatment on the surface of the optical functional layer, and
an antifouling layer forming step of forming the antifouling layer on the surface-treated optical functional layer,
wherein a relative output value of an integrated output of the glow discharge treatment of the surface treatment step is 100 or more and 333 or less when the integrated output of 326 W·min/mm$^2$ is set to be 100 as the relative output value of the integrated output.

2. The method of manufacturing the optical laminate according to claim 1, wherein in the adhesion layer forming step and the optical functional layer forming step, the adhesion layer and the optical functional layer are formed by sputtering.

3. The method of manufacturing the optical laminate according to claim 1, wherein in the antifouling layer forming step, the antifouling layer is formed by vacuum deposition.

4. The method of manufacturing the optical laminate according to claim 1, wherein the adhesion layer forming step, the optical functional layer forming step and the surface treatment step are continuously performed under reduced pressure.

5. The method of manufacturing the optical laminate according to claim 1, wherein the optical functional layer is one kind selected from an anti-reflection layer, a selective reflection layer and an antiglare layer.

6. The method of manufacturing the optical laminate according to claim 1, wherein the optical functional layer comprises a low refractive index layer.

7. The method of manufacturing the optical laminate according to claim 1, wherein the optical functional layer forming step is a step of alternately laminating a low refractive index layer and a high refractive index layer to form a laminate.

* * * * *